United States Patent
Satoh et al.

[19]

[11] Patent Number: 6,057,907
[45] Date of Patent: May 2, 2000

[54] METHOD OF AND SYSTEM FOR EXPOSING PATTERN ON OBJECT BY CHARGED PARTICLE BEAM

[75] Inventors: Takamasa Satoh; Soichiro Arai; Kenichi Miyazawa; Yoshihisa Ooaeh; Junichi Kai; Hiroshi Yasuda, all of Kawasaki, Japan

[73] Assignee: Fujitsu Limited, Kawasaki, Japan

[21] Appl. No.: 09/132,698

[22] Filed: Aug. 12, 1998

Related U.S. Application Data

[62] Division of application No. 08/651,586, May 22, 1996, Pat. No. 5,866,300.

[30] Foreign Application Priority Data

Sep. 7, 1995 [JP] Japan ................................. 7-230176

[51] Int. Cl.$^7$ .......................... G03B 27/42; G03B 27/54; A61N 5/00
[52] U.S. Cl. .......................... 355/53; 355/67; 250/492.2
[58] Field of Search ................................. 430/296, 327; 250/492.2, 492.21, 492.22, 492.23, 492.3, 559.3; 355/53, 67, 68, 69

Primary Examiner—David M. Gray
Assistant Examiner—Peter B. Kim
Attorney, Agent, or Firm—Staas & Halsey

[57] ABSTRACT

Before figure data are expanded into a bitmap, a checksum is calculated in unit of bitmap data corresponding to a cell stripe of scanning over which continuous exposure is possible. When the checksum is calculated after expanding the data into the bitmap, the interim calculation result of refocus values is used. In exposure, exposing k number of sub rectangular areas by repeating a sub scanning k number of times, jumping a deflection by a main deflector toward an center of remaining sub rectangular areas whose number is (p-k) inside a main rectangular areas and exposing remained (p-k) number of the sub rectangular areas by repeating the sub scanning (p-k) times after the jumping is settled. In an amplifier & low pass filter for supplying a drive voltage to a sub deflector, the cutoff frequency is lowed during flyback in a sawtooth waveform without changing an amplification factor.

3 Claims, 16 Drawing Sheets

METHOD OF AND SYSTEM FOR EXPOSING PATTERN ON OBJECT BY CHARGED PARTICLE BEAM

This application is a division of application Ser. No. 08/651,586, filed May 22, 1996, now allowed U.S. Pat. No. 5,866,300.

BACKGROUND OF THE INVENTION

1. Field of the Invention

The present invention relates to a method of and a system for exposing a pattern on an object, such as a semiconductor wafer or a mask coated with resist, by a charged particle beam passing through a blanking aperture array to make multibeam.

2. Description of the Related Art

In the current trend for miniaturization of the elements used in semiconductor integrated circuits, application of charged particle beam exposure systems in mass production is eagerly awaited. Generally, electrons are used for charged particles. In such a system, it is possible to perform fine processing at 0.05 µm or smaller with a positioning precision of 0.02 µm or smaller. A charged particle beam is caused to scan and, as a result, the exposure time is longer compared to that in light exposure. To reduce this problem, there is a method that uses a blanking aperture array (BAA) to make a charged particle beam a multibeam (U.S. Pat No. 4,153,843 corresponding to First Publication No. 53-117387 of Japanese Patent Application). With this method, exposure of minute patterns at high speed, for example 100 mm/sec, of a mobile stage upon which the wafer is mounted is expected. The mobile stage is continuously moved while the multibeam is deflected by a main deflector and a sub deflector. However, since exposure is performed by the charged particle beam scanning, the exposure takes longer than in photo exposure. Because of this, it is necessary to improve the throughput of the charged particle beam exposure system.

(1) Reduction in throughput of exposure depending upon the scanning method.

Scanning of the charged particle beam on a semiconductor wafer is performed by the mobile stage upon which the wafer is mounted, the main deflector and the sub deflector that are positioned above the mobile stage. Normally, the main deflector is the electromagnetic type and the sub deflector is the electrostatic type.

The ranges over which scanning is possible at the required accuracy with these means are, from largest to smallest: the mobile stage, the main deflector, the sub deflector. However, the order of their scanning speeds is, from fastest to slowest: the sub deflector, the main deflector, the mobile stage. By taking advantage of these characteristics of the scanning means, the scanning of the charged particle beam onto the wafer is performed as shown in FIGS. 13(A) and 13(B).

In FIG. 13(A), areas 111 to 115 on the semiconductor wafer 10 are scanned continuously by the mobile stage, as indicated with the alternate long and short line L1. Also, the areas between the centers of the subfields are scanned in steps by the main deflector in the order of the subfields: 12, 13, 14, 15D, . . . , see line L2. However, if no exposure data are present in the subfields between the subfields 13 and 16, for instance, the main deflector jumps from the subfield 13 to the subfield 16. Each subfield is scanned by the sub deflector in the state in which the main deflection is constant.

In FIG. 13(B), the range over which the multibeam, which has passed through a BAA 30, to be explained later, can be deflected by the sub deflector is A1, indicated by the alternate long and short line, with the scanning point of the main deflector at Q1. The subfield 12 is scanned by the sub deflector along the alternate long and two short dashes line L3 and the dotted line L4 in the order of cell strips 121 to 125. The alternate long and two short dashes line L3 is a scanning line during exposure and the dotted line L4 is at blanking (flyback). During sub scanning, since the semiconductor wafer 10 is continuously moving on the mobile stage, the scanning point of the main deflector is at Q2 at the end of the scanning of the subfield 12.

In this state, the scanning point of the main deflector is changed in one step to Q3, shifting the range of the sub deflection to A2, indicated with the alternate long and two short dashes line, and the subfield 13 is scanned by the sub deflector in the order of cell stripes 131 to 135 in the same manner.

The scanning described above is performed repeatedly.

When exposure data are present in the cell stripe 131 but no exposure data are present in the cell stripes 132 to 135, for instance, too, the main scanning point must be changed from Q2 to Q3 in a large step and because of this, settling time at the time of the step change is lengthened, causing a reduction in the throughput of exposure.

In addition, if cell stripes are shortened to perform sub scanning so as to ensure that the scan never exceeds the sub scanning range A1, the total number of cell stripes must be increased, increasing the number of times flyback must be implemented during sub scanning and lowering the throughput of exposure.

(2) Lowering throughput of exposure during sub scanning

FIG. 14 (A) shows a drive circuit for an electrostatic sub deflector 20 for deflecting a multibeam EB2.

The quantity of sub deflection QRX2 is converted to an analog current QRX3 at a D/A converter 21 and changes as shown in FIG. 14(B). The current QRX3 is converted to a voltage QRX4 by a current/voltage converter 22. Although the response frequency of the D/A converter 21 is approximately 10 to 20 MHz, the frequency of the data supplied to the BAA is set to, for instance, 400 MHz for high speed exposure and, therefore, it is necessary to cause the sub deflector 20 to continuously scan the multibeam EB2 by smoothing the waveform of the voltage QRX4. To achieve this, the voltage QRX4 is amplified and the high frequency component is cut at an amplification & low pass filter circuit 28 and becomes a smooth voltage QRX5, as shown in FIG. 14(B). Points R1, R2 and R3 in the graph of the voltage QRX5 correspond to points R1, R2 and R3 respectively in FIG. 13(B).

During the time t3, the current QRX3 changes in small steps from the maximum value to the minimum value, and the voltage QRX5 changes linearly from the minimum value to the maximum value. However, when the current QRX3 has changed in a large step from the minimum value to the maximum value, the voltage QRX5, with its high frequency component cut at the amplification & low pass filter circuit 23, steps down gently and the time period elapsing during this process, i.e., the time t2, is approximately equal to t3. The time t1 or t3 and the time t2 are both approximately 4 µs. Since t2 is wasted time, in order to improve the throughput of exposure, it is necessary to minimize t2/t1.

(3) Lowering throughput of exposure caused by error detection and correction

FIG. 15 shows a BAA 30 and a multi-beam controlling circuit.

In the BAA 30, a lattice of apertures 33 is formed inside an area 32 of a thin substrate 31. For each aperture 33, a pair of electrodes, one a common electrode 34 and the other a blanking electrode 35, are formed on the substrate 31 with the common electrode 34 connected to the ground line.

A charged particle beam is projected to the area 32 on the substrate 31. A charged particle beam that has passed through an aperture 33 then passes through a round aperture on the aperture stop under the BAA 30 so long as the potential of the blanking electrode 35 is set to 0 V. However, if a non-zero potential Vs is applied to the blanking electrode 35, the charged particle beam is deflected and is blocked at the aperture stop under the BAA 30. Consequently, by providing a 0/Vs potential pattern to the blanking electrodes 35 in correspondence to the bitmap data of a exposure pattern, a desired fine pattern can be exposed on the semiconductor wafer 10.

For instance, each aperture 33 is a square with its sides at 25 $\mu$m and the area exposed on the semiconductor wafer 10 by this aperture 33 is an approximately square shape with sides at 0.08 $\mu$m. The direction X is referred to as the lengthwise direction of the rows of the apertures 33 and two actual rows of the apertures 33 are considered as one logical row. For the sake of simplification, FIG. 15 shows the apertures 33 in three logical rows over twenty columns, but in reality, the apertures 33 may be formed, for instance, in eight logical rows over 128 columns.

When there are m logical rows over n columns of apertures 33, the aperture 33 and the blanking electrode 35 in the i-th row at the j-th column are indicated as the aperture 33(i,j) and the blanking electrode 35(i,j) respectively. The pitch p of the apertures 33 in the direction Y must be, for instance, three times the length a of one side of the aperture 33, in order to secure enough area for the electrodes and wiring.

A BAA drive circuit (multibeam control circuit) 40 is provided with dot buffer memories 411 to 41$n$ in which bitmap data of patterns provided through read/write circuit 42 are written. A dot buffer memory 41$j$ (j is anyone of 1 to n) outputs dot data for j-th column of the blanking electrode 35. Each of the dot buffer memories 411 to 41$n$ have the same storage capacity.

A n-bit parallel data that corresponds to the 1st to nth column of the blanking electrodes 35 is output by a clock, address and control signals from a control circuit 43 which is operated in synchronization with a clock $\phi$ 0. Each of the dot buffer memories 411 to 41$n$ is divided into, for instance, two areas so that while dot data are written in one area through a direct memory access, dot data are read out from the other area. Each time the read and write for one frame is completed, the read area and the write area are switched.

A dot data from the dot buffer memory 41$j$ having parallel/serial conversion circuit at an output stage is provided to the data input of the least significant bit of a shift register 44$j$. The shift register 44$j$ is shifted by one bit toward the higher digit by one clock pulse from the control circuit 43, a frequency of the clock being, for instance, 400 MHz.

As shown in FIG. 16, the electrode 35(i, j) is connected via a transistor switch to a voltage source line of the potential Vs or a grand line. A k-th bit output from the least significant bit (0-th bit) of the shift registers 44$j$ is connected to a control input of the transistor switch. Where k is expressed as $k=2(p/a)$ $(i-1)$ when j is an odd number and $k=2$ $(p/a)$ $(2i-1)$ when j is an even number.

The potential of the blanking electrode 35(i, j) is at 0/Vs when the k-th bit of the shift registers 44$j$ is '1'/'0', and the charged particle beam which has passed through the aperture 33 (i, j) is radiated on the semiconductor wafer 10 only when this potential is at 0 V. The scanning speed of the charged particle beam is adjusted at a constant level so that, when the cycle of the clock $\phi$ is T, supposing that the charged particle beam passes the aperture 33 (1, j) at a time point t=0 irradiates a point P on the semiconductor wafer 10, the charged particle beams that pass through the aperture 33(2, j), the aperture 33(3, j), . . . , the aperture 33(m, j) at time points t=2(p/a)T, t=4(p/a)T, . . . , T=2(m−1) (p/a)T respectively, irradiate the same point P on the semiconductor wafer 10.

Thus, on the semiconductor wafer 10, the same spot is exposed m times with the same dot data. In addition, the spaces between dots that are exposed at the time point t after the beam passes through the aperture 33 (i, j), j=1, 3, 5, . . . , n−1 are exposed at time point t+(p/a) T after the beam passes through the apertures 33 (i, j), j=2, 4, 6, . . . , n.

For instance, when the area exposed on the semiconductor wafer 10 by one aperture in BAA is a square with sides at 0.08 $\mu$m and the area to be exposed on a semiconductor chip is a square with sides at 20 mm, at least $(20,000/0.08)^2$=62.5 Gbit is needed for exposure data. For instance, four times as many as that, namely 250 Gbit, is needed for exposure data if length adjustment of patterns or correction of proximity effect with high accuracy is performed.

Since huge quantities of data are read out, written and transferred at high speed via the BAA drive circuit 40 in FIG. 15 and a data generating circuit provided at a stage preceding the BAA drive circuit, it is necessary to improve reliability by detecting an error when bits are inverted due to noise. Usually, parity check is employed to detect data errors in the transfer path. However, since one parity bit is required for each byte of 8 bits, 64 parity check circuits will be required for 512-bit parallel data, increasing the scale of the circuits. In addition, although error detection and correction can be performed by an ECS (Error Correction System), the circuit scale will be larger than that of the party check circuits and, moreover, high speed processing at the 400 MHz level becomes difficult. Thus, the speed at which data are transferred to the BAA 30 must be lowered for error detection, causing a reduction in throughput of exposure.

SUMMARY OF THE INVENTION

Accordingly, an object of the present invention is to provide a method of and a system for exposing a pattern on an object by a charged particle beam using a blanking aperture array that can improve the throughput of exposure.

According to the 1st aspect of the present invention, there is provided a method of exposing a pattern on an object by a charged particle beam, the method using: a blanking aperture array mask having a substrate, aperture array on the substrate and a pair of electrodes on the substrate for each aperture, the blanking aperture array being positioned in a path of the charged particle beam; a charged particle beam radiating apparatus for making a multibeam by projecting the charged particle beam on to the blanking aperture array mask; a multibeam controller for providing or not a voltage between each of the pairs of electrodes based upon pattern bitmap data in order to radiate or not the charged particle beam passed through the apertures on the object; and a deflector for deflecting the multibeam; the method comprising the steps of: (1) counting a total bit number of one of "1"

and "0" in the bitmap data within a band area as a first checksum before the bitmap data are supplied to the multibeam controller, the band area being for continuously scanning the charged particle multibeam on the object; (2) obtaining a second checksum of the bitmap data within the band area before the bitmap data are supplied to the multibeam controller, the second checksum corresponding to the first checksum; and (3) comparing the first checksum against the second checksum.

With the 1st aspect of the present invention, the checksum is detected in unit of bitmap data within the range of the band areas for scanning, the structure for detecting errors is simplified and it becomes unnecessary to lower the speed at which the band areas is scanned on account of error detection, making it possible to improve the throughput of exposure.

In the 1st mode of the 1st aspect of the present invention, the step (2) is executed in real time during exposure, the bitmap data for the second checksum sequentially taken out from an output of the multibeam controller.

In the 2nd mode of the 1st aspect of the present invention, the step (1) is performed by calculating a total area of a figure within the band area before expanding the figure data into the bitmap data.

With the 2nd mode, by determining the entire area of the figures within the range of the band areas for scanning before the figure data are expanded into bitmap, a first checksum can be determined with ease.

In the 3rd mode of the 1st aspect of the present invention, the step (1) is executed after expanding the figure data into the bitmap data.

In the 4th mode of the 1st aspect of the present invention, the step (1) is performed by calculating a total area of a figure within the band area before expanding the figure data into the bitmap data; and the step (2) is executed after expanding the figure data into the bitmap data; the method further comprises the step of executing the step (2) again when the first and second checksum are not equal to each other.

With the 4th mode, since error detection and correction are performed during bitmap expansion processing, the reliability of exposure data improves. Also, since it is not necessary to provide two same systems of bitmap expansion, the structure for error detection and correction during bitmap expansion processing can be simplified.

In the 5th mode of the 1st aspect of the present invention, the step (1) and (2) are performed in parallel for two sets of identical bitmap data; the method further comprises the step of executing the step (2) again when the first and second checksum are not equal to each other.

With the 5th mode, since error detection and correction are performed during bitmap expansion processing, the reliability of the exposure data improves.

In the 6th mode of the 1st aspect of the present invention, the step (1) includes the steps of: taking out the bitmap data sequentially in an unit of n bits from an output of the multibeam controller; counting a total bit number of one of "1" and "0" in the n bits; accumulating the total bit number as a sum; holding the sum of (m+1) number spanning from the m times previous sum to the current sum; subtracting the current sum from the m times previous sum to obtain a refocus value for correcting focal point blur of the multibeam caused by Coulomb repelling force; and obtaining the sum as the first checksum corresponding to the band area.

With the 6th mode, since the calculation of a checksum can be performed with interim results of the calculation of the refocus value, the structure for determining the checksum is simplified.

According to the 2nd aspect of the present invention, there is provided a method of exposing a pattern on an object by a charged particle beam, the method using: a blanking aperture array mask having a substrate, aperture array on the substrate and a pair of electrodes on the substrate for each aperture, the blanking aperture array being positioned in a path of the charged particle beam; a charged particle beam radiating apparatus for making a multibeam by projecting the charged particle beam on to the blanking aperture array mask; a multibeam controller for providing or not a voltage between each of the pairs of electrodes based upon pattern bitmap data in order to radiate or not the charged particle beam passed through the apertures on the object; a mobile stage for mounting the object; a sub deflector for deflecting the multibeam within a sub deflection range; and a main deflector for deflecting the multibeam within a main deflection range, the main deflection range being larger than the sub deflection range; the method comprising the steps of: dividing exposure area into main rectangular areas and dividing each of the main rectangular areas into sub rectangular areas, the sub rectangular areas in the same main rectangular area being identical bands and being parallel to one another; scanning linearly once as a sub scanning by the sub deflector along the sub rectangular area to expose the sub rectangular area, with moving the mobile stage in a length direction of the sub rectangular area at a constant speed V and with making a deflection by the main deflector constant; determining a value k that satisfies $kV\Delta t \leq AL < (k+1)V\Delta t$, where AL is a distance along a direction of a movement of the mobile stage between a boundary of the sub rectangular area and a boundary of a range to be able to scan by the sub deflector at a first start time point of the sub scanning, and $\Delta t$ is a time spanning from a start point of the sub scanning to a next start point of the sub scanning, exposing k number of the sub rectangular areas lying continuously in parallel to each other as a first exposing area by repeating the sub scanning k number of times, if k is smaller than p which is a number of the sub rectangular area in one of the main rectangular areas; and jumping a deflection by the main deflector toward an approximate center of remaining sub rectangular areas whose number is (p−k) inside the main rectangular areas after the first exposing area; exposing remained (p−k) number of the sub rectangular areas as a second exposing area by repeating the sub scanning (p−k) times after the jumping is settled.

With the 2nd aspect of the present invention, when p>k, the step change of deflection by the main deflector is smaller compared to that when p≦k. Therefore, the wasted settling time for the step change is reduced, improving the throughput of exposure. Furthermore, since the sub rectangular areas do not have to be shortened to ensure that the scan never exceeds the sub deflection range, and consequently, an increase in the total number of sub rectangular areas can be avoided, a reduction in the throughput caused by an increase in the total of wasted time elapsing between scanning of a sub rectangular area and scanning of the next sub rectangular area is prevented.

In the 1st mode of the 2nd aspect of the present invention, a jump flag is provided in regard to each of the sub rectangular areas and a value of the jump flag, corresponding to k-th the sub rectangular area from one end in the main rectangular area, is made to differ from a value of other jump flags, and the jumping is performed based upon the jump flag.

With the 1st mode, because the value of the jump flag is determined at the time of exposure data generation, it is not necessary to calculate k in real time during the exposure processing.

In the 2nd mode of the 2nd aspect of the present invention, the k is calculated before scanning of next the main rectangular areas starts; and the jumping is performed based upon a number of the sub scanning, the number of the sub scanning being counted after starting a scan of the main rectangular area.

With the second mode, since it is not necessary to use a jump flag, the quantity of exposure data can be reduced and the structure of the exposure data can be simplified.

In the 3rd mode of the 2nd aspect of the present invention, k-th the sub rectangular area currently being scanned is judged by a elapsed time from starting a scan of the main rectangular areas having reached (AL/V−t); and the jumping is performed based upon the judgment.

With the 3rd mode, it is not necessary to count the scanning number of the sub rectangular area.

According to the 3rd aspect of the present invention, there is provided a method of exposing a pattern on an object by a charged particle beam, the method using: a blanking aperture array mask having a substrate, aperture array on the substrate and a pair of electrodes on the substrate for each aperture, the blanking aperture array being positioned in a path of the charged particle beam; a charged particle beam radiating apparatus for making a multibeam by projecting the charged particle beam on to the blanking aperture array mask; a multibeam controller for providing or not a voltage between each of the pairs of electrodes based upon pattern bitmap data in order to radiate or not the charged particle beam passed through the apertures on the object; a deflector for deflecting the multibeam; a digital-to-analog converter; and an amplification & low pass filter circuit having a control input to select one of a first cut-off frequency and a second cut-off frequency without changing an amplification factor, the second cut-off frequency being larger than the first cut-off frequency, the amplification & low pass filter circuit being connected between the digital-to-analog converter and the deflector; the method comprising the steps of: changing an output of the D/A converter from a third value toward a fourth value a plurality of times so as to change an input drive signal of the deflector smoothly, and making the amplification & low pass filter circuit select the first cut-off frequency during the changing; and changing the output of the D/A converter from the fourth value to the third value in one time while the charged particle multibeam is not irradiated on the object, and making the amplification & low pass filter circuit select the second cut-off frequency while the charged particle multibeam is not irradiated on the object.

In the 3rd aspect of the present invention, since the (duration of the second process) (duration of the first process) can be reduced compared to that when the cut-off frequency is fixed at a first value, the wasted time is reduced and the throughput of exposure is improved.

According to the 4th aspect of the present invention, there is provided a system for exposing a pattern on an object by a charged particle beam, the system comprising: a blanking aperture array mask having a substrate, aperture array on the substrate and a pair of electrodes on the substrate for each aperture, the blanking aperture array being positioned in a path of the charged particle beam; a charged particle beam radiating apparatus for making a multibeam by projecting the charged particle beam on to the blanking aperture array mask; a multibeam controller for providing or not a voltage between each of the pairs of electrodes based upon pattern bitmap data in order to radiate or not the charged particle beam passed through the apertures on the object; and a deflector for deflecting the multibeam; the system further comprising: a first checksum calculator for counting a total bit number of one of "1" and "0" in the bitmap data within a band area as a first checksum before the bitmap data are supplied to the multibeam controller, the band area being for continuously scanning the charged particle multibeam on the object; a second checksum calculator for obtaining a second checksum of the bitmap data within the band area before the bitmap data are supplied to the multibeam controller, the second checksum corresponding to the first checksum; and a comparator for comparing the first checksum against the second checksum.

According to the 5th aspect of the present invention, there is provided a system for exposing a pattern on an object by a charged particle beam, comprising: a blanking aperture array mask having a substrate, aperture array on the substrate and a pair of electrodes on the substrate for each aperture, the blanking aperture array being positioned in a path of the charged particle beam; a charged particle beam radiating apparatus for making a multibeam by projecting the charged particle beam on to the blanking aperture array mask; a multibeam controller for providing or not a voltage between each of the pairs of electrodes based upon pattern bitmap data in order to radiate or not the charged particle beam passed through the apertures on the object; a mobile stage for mounting the object; a sub deflector for deflecting the multibeam within a sub deflection range; and a main deflector for deflecting the multibeam within a main deflection range, the main deflection range being larger than the sub deflection range; the system further comprising: means for dividing exposure area into main rectangular areas and for dividing each of the main rectangular areas into sub rectangular areas, the sub rectangular areas in the same main rectangular area being identical bands and being parallel to one another; means for determining a value k that satisfies $kV\Delta t \leq AL < (k+1)V\Delta t$, where AL is a distance along a direction of a movement of the mobile stage between a boundary of the sub rectangular area and a boundary of a range to be able to scan by the sub deflector at a first start time point of a sub scanning, and $\Delta t$ is a time spanning from a start point of the sub scanning to a next start point of the sub scanning; and exposure controller for scanning linearly once as the sub scanning by the sub deflector along the sub rectangular area to expose the sub rectangular area, with moving the mobile stage in a length direction of the sub rectangular area at a constant speed V and with making a deflection by the main deflector constant, for exposing k number of the sub rectangular areas lying continuously in parallel to each other as a first exposing area by repeating the sub scanning k number of times, if k is smaller than p which is a number of the sub rectangular area in one of the main rectangular areas, for jumping a deflection by the main deflector toward an approximate center of remaining sub rectangular areas whose number is (p−k) inside the main rectangular areas after the first exposing area, and for exposing remained (p−k) number of the sub rectangular areas as a second exposing area by repeating the sub scanning (p−k) times after the jumping is settled.

According to the 6th aspect of the present invention, there is provided a system for exposing a pattern on an object by a charged particle beam, comprising: a blanking aperture array mask having a substrate, aperture array on the substrate and a pair of electrodes on the substrate for each aperture, the blanking aperture array being positioned in a path of the charged particle beam; a charged particle beam radiating apparatus for making a multibeam by projecting the charged particle beam on to the blanking aperture array mask; a multibeam controller for providing or not a voltage between each of the pairs of electrodes based upon pattern bitmap data in order to radiate or not the charged particle beam passed through the apertures on the object; a deflector for deflecting the multibeam; and a deflection controller; the deflection controller comprising: a digital-to-analog converter; an amplifier & low pass filter having a control input to select one of a first cut-off frequency and a second cut-off frequency without changing an amplification factor, the second cut-off frequency being larger than the first cut-off frequency, the amplification & low pass filter circuit being connected between the digital-to-analog converter and the deflector; and a waveform controller for changing an output of the D/A converter from a third value toward a fourth value a plurality of times so as to change an input drive signal of the deflector smoothly, and making the amplification & low pass filter circuit select the first cut-off frequency during the changing, and for changing the output of the D/A converter from the fourth value to the third value in one time while the charged particle multibeam is not irradiated on the object, and making the amplification & low pass filter circuit select the second cut-off frequency while the charged particle multibeam is not irradiated on the object.

DESCRIPTION OF THE PREFERRED EMBODIMENTS

First Embodiment

Figure 1:
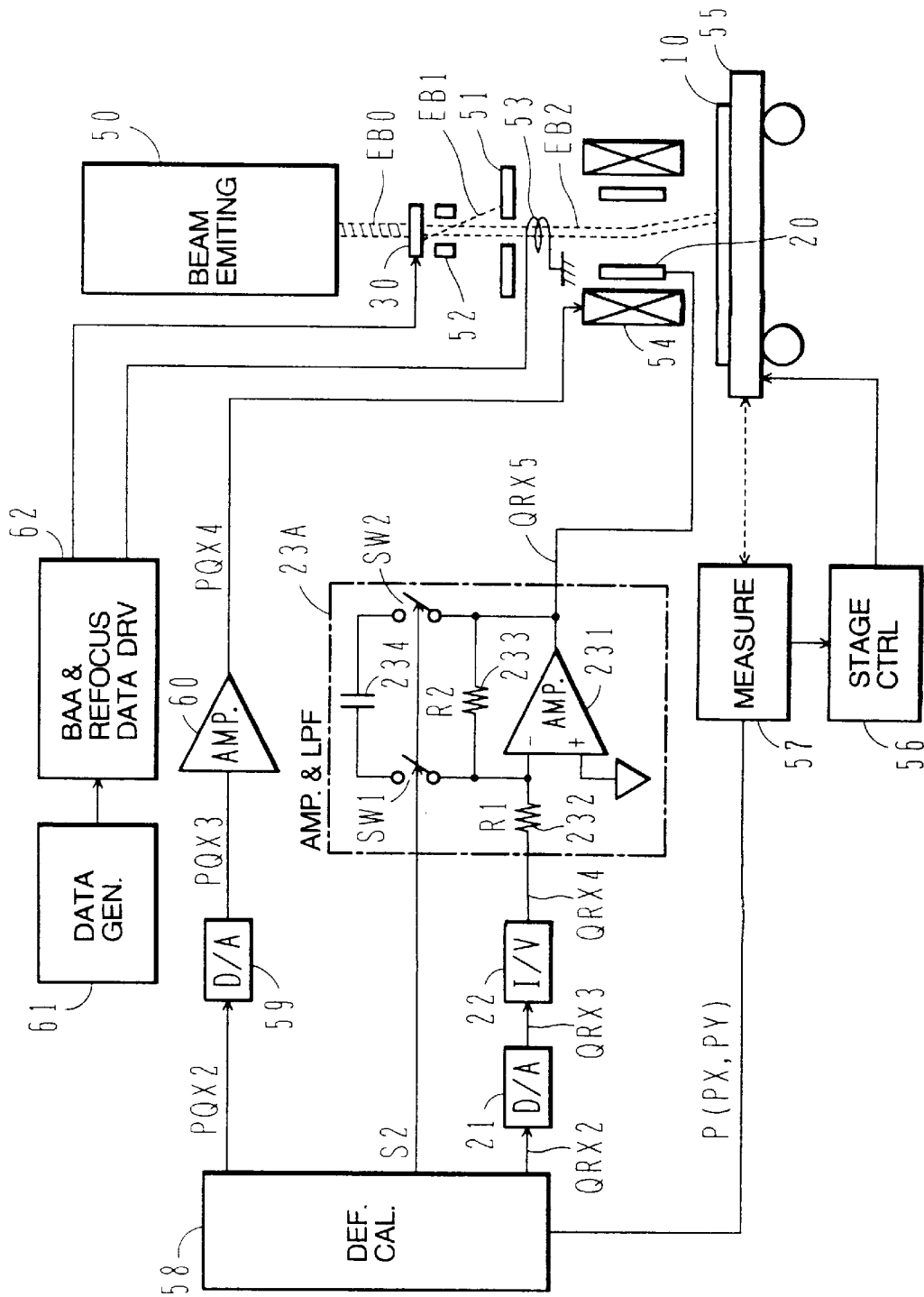
FIG. 1 is a schematic diagram of an apparatus for charged particle multibeam exposure in the first embodiment according to the present invention.

FIG. 1 shows a schematic structure of a system for charged particle multibeam exposure in the first embodiment according to the present invention.

(1) Overview of system for charged particle multibeam exposure

A charged particle beam EB0 emitted from a charged particle beam emitting apparatus 50 is made to multibeam through a BAA 30, and a portion EB1 of the charged particle beam is deflected and is blocked at the aperture stop 51 under the BAA 30. Consequently, the cross section of the charged particle beam EB1 (ON beams) is formed to be a dot pattern. The charged particle beam EB0 is emitted continuously and between the cell stripe scanning end point R2 and the cell stripe scanning start point R3 in FIG. 7(A), for instance, the entire multibeam is deflected by a blanking deflector 52 and is blocked by an aperture stop 51.

Since the ON beams EB2 conflict with each other due to Coulomb forces acting between the beams, the focal point is offset downward relative to the surface of the semiconductor wafer 10, resulting in a blurred image. In order to prevent such blurring, a refocus coil 53 is provided under the aperture stop 51, coaxially with the optical axis and an electrical current proportionate to the number of ON beams EB2 is supplied to the refocus coil 53 so that the ON beams EB2 approach each other due to the magnetic field of the refocus coil 53. The ON beams EB2 is deflected by a sub deflector 20 and a main deflector 54, and is focused on the semiconductor wafer 10 through a electromagnetic lens not shown.

The semiconductor wafer 10 is mounted on a mobile stage 55. The movement of the mobile stage 55 is controlled by a stage control circuit 56 with the position of the mobile stage 55 being detected by a laser interferometric measuring machine 57.

The ON beams EB2 are radiated at the intersection, which is mobile stage scanning position P, of a optical axis of the exposure system and the semiconductor wafer 10. A laser gauge interferometer 57 provides the coordinates (PX, PY) of the mobile stage scanning position P relative to a fixed origin point on the semiconductor wafer 10, to a deflection quantity calculating circuit 58. In order to ensure that multibeam EB2 is irradiated at the target position on the semiconductor wafer 10 by the main deflector 54 and the sub deflector 20, the deflection quantity calculating circuit 58 calculates the main deflection quantity PQX2 and the sub deflection quantity QRX2, which are to be explained later, and supplies them to a D/A converter 59 and a D/A converter 21 respectively. For the purpose of simplification, the drive circuits for only one deflection coil of the main deflector 54 and for only one deflection electrode plate of the sub deflector 20 are shown in FIG. 1. So, the drive circuits for the Y-direction deflection components in the main deflector 54 and in the sub deflector 20 are omitted in the figure.

The main deflection quantity PQX2 is converted to an analog current PQX3 by the D/A converter 59 and then amplified by an amplifier 60. It is then supplied to the main deflector 54 as a drive current PQX4.

Bitmap data for exposure and refocus data are generated by a data generating circuit 61, and are supplied to the BAA 30 and the refocus coil 53 respectively via a BAA & refocus coil drive circuit 62.

(2) Sub deflector drive circuit

The sub deflection quantity QRX2 is converted to an analog current QRX3 at the D/A converter 21, further converted to a voltage QRX4 at a current/voltage converter 22 and is then amplified with its high frequency component, which has been generated by the step change, cut at an amplification & low pass filter circuit 23A to become a drive voltage QRX5 before it is supplied to the sub deflector 20.

In the amplification & low pass filter circuit 23A, one end each of a resistor 232 with a resistance R1, a resistor 233 with a resistance R2, and a switch element SW1 is connected to the inverting input of a operation amplification circuit 231 with the other end of the resistor 233 connected to the output of the operation amplification circuit 231. The other end of the switch element SW1 is connected to an output of the operation amplification circuit 231 via a capacitor 234 and a switch element SW2. The switch elements SW1 and SW2 interlock with each other by a control signal S2 from the deflection quantity calculating circuit 58 to be ON/OFF controlled as shown in FIG. 6.

Namely, while the current QRX3 changes in small steps, the switch elements SW1 and SW2 are turned ON so that the amplification & low pass filter circuit 23A performs the amplification operation and the high frequency component cutting operation, to smooth the step change to the voltage QRX4. At this time, the cutoff angular frequency of the amplification & low pass filter circuit 23A is at $1/(R2 \cdot C)$ and the amplification factor of the amplification & low pass filter circuit 23A is at R2/R1.

When the sub deflection quantity QRX2 changes in a large step from the minimum value to the maximum value, the control signal S2 turns the switch elements SW1 and SW2 OFF for a specific length of time. With this, the capacity connected with the resistance R2 becomes the capacity component of the resistor 233 and its lead line. As a result, the cutoff angular frequency becomes higher and the voltage QRX5 returns from the maximum value to the minimum value quickly. At this time, since the amplification factor of the amplification & low pass filter circuit 23A remains unchanged at R2/R1, the maximum and minimum value of the voltage QRX5 are the same as those when the switch elements SW1 and SW2 are ON.

Figure 6:
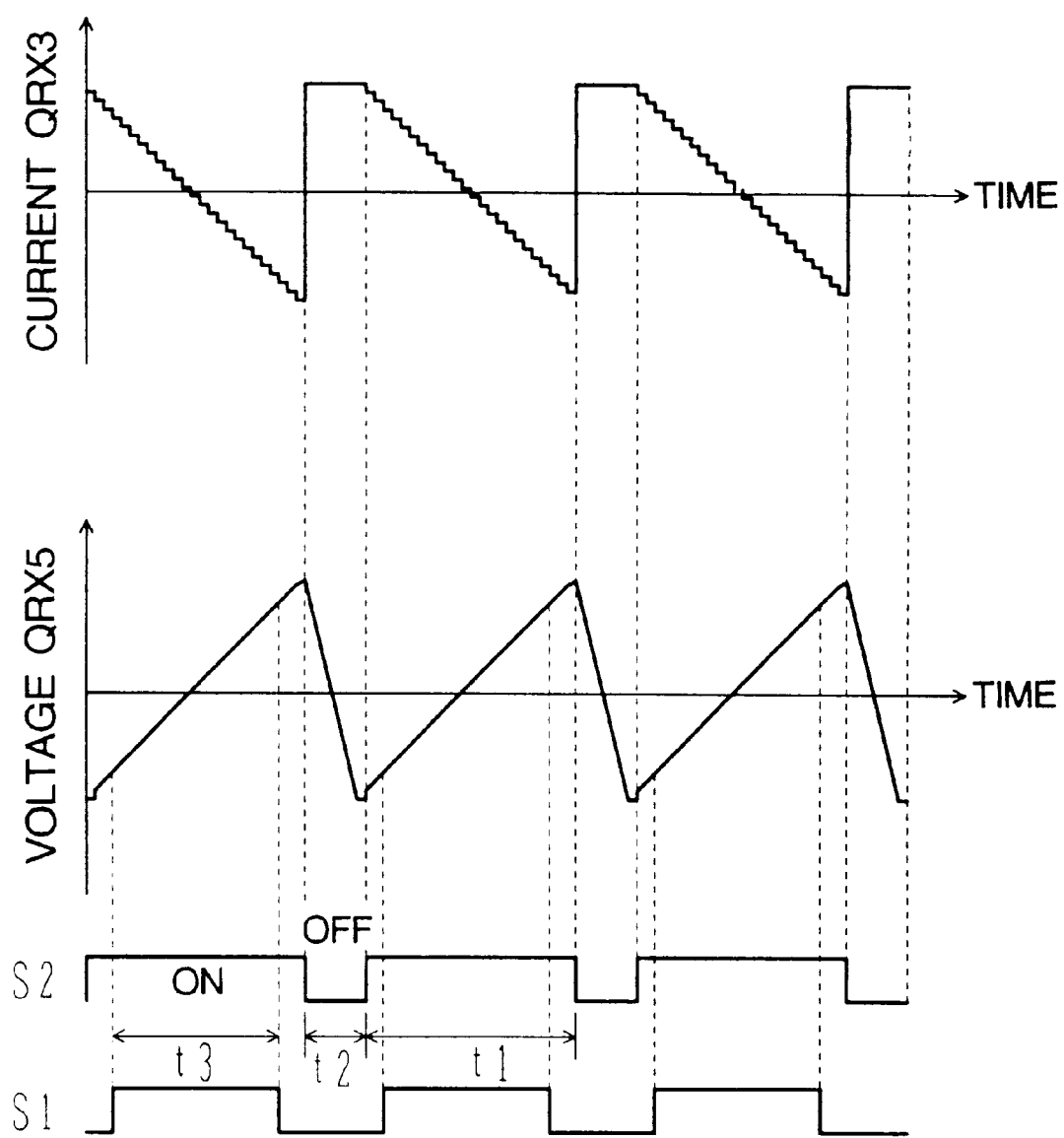
FIG. 6 is a waveform diagram showing an operation of a sub deflector drive circuit in FIG. 1.

When R1=500 Ω, R2=2 kΩ and C=800 pF, t1 and t2 in FIG. 6 are respectively 4 μs and 200 ns so that t2/t1=1/20, making it possible to reduce the exposure time to 21/40 of that in the prior art.

(3) Method of charged particle multibeam scanning

Figure 7:
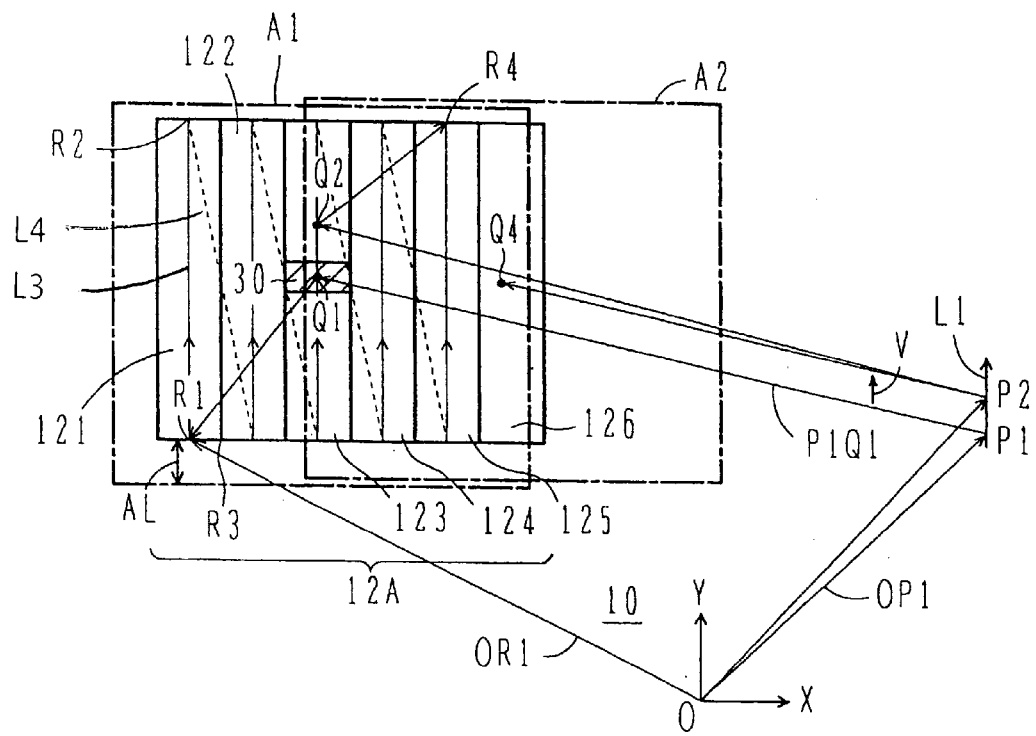
FIG. 7(A) illustrates a method of scanning a charged particle multibeam.
FIG. 7(B) is a vector diagram showing a relationship of data in FIG. 2.
Figure 7:
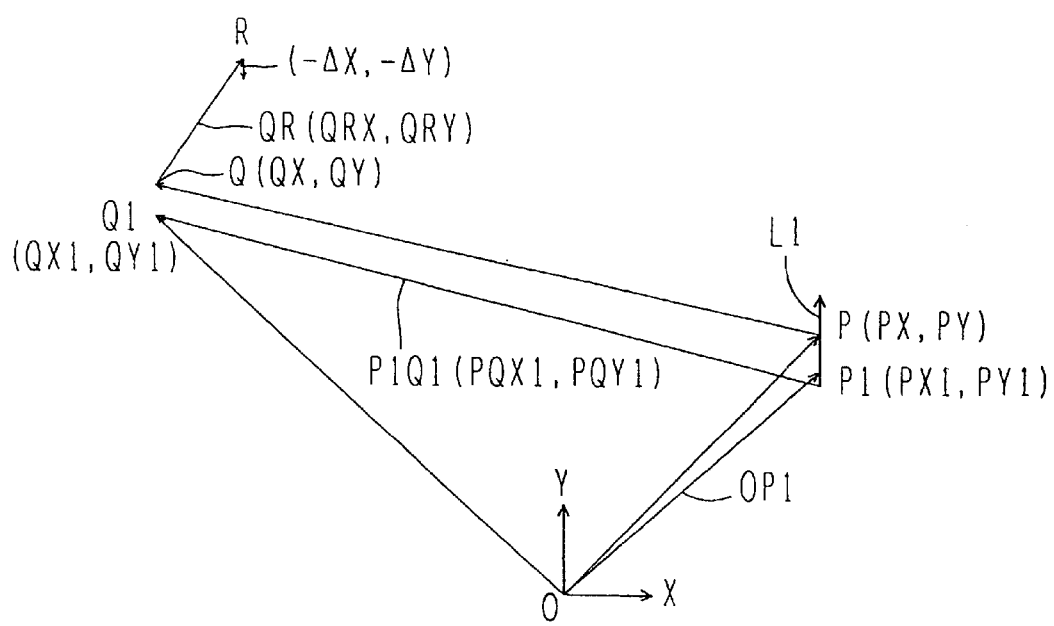
Figure 13:
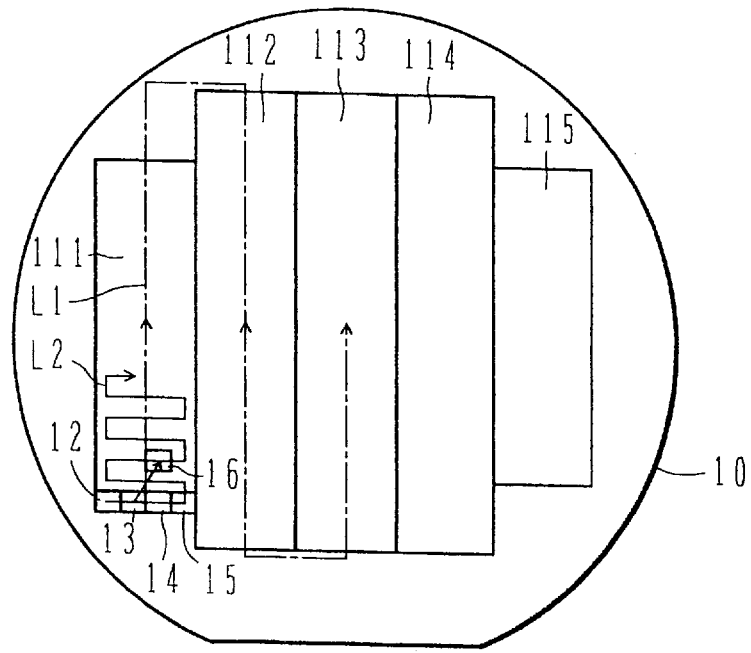
FIGS. 13(A) and 13(B) illustrate a method of charged particle multibeam exposure in the prior art which uses a BAA.
Figure 13:
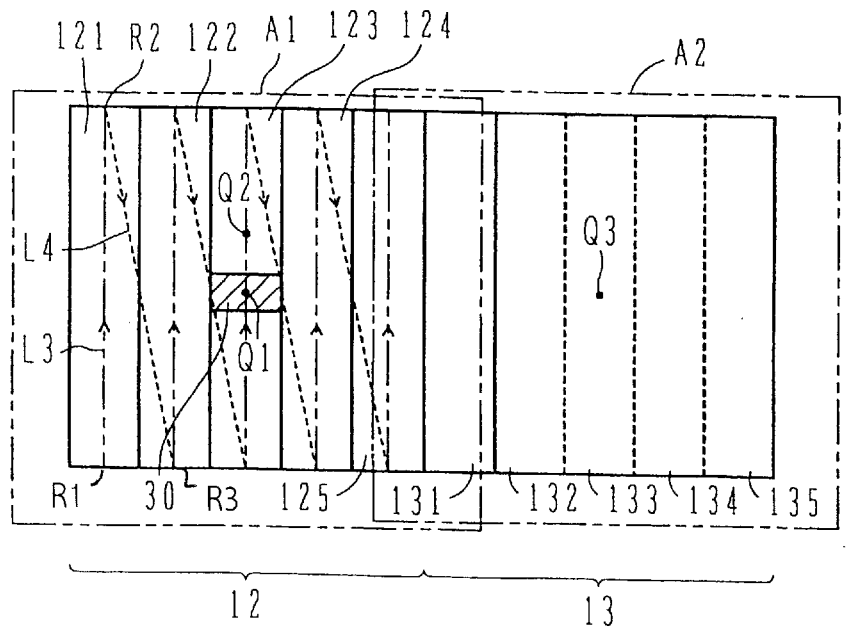
Figure 14:
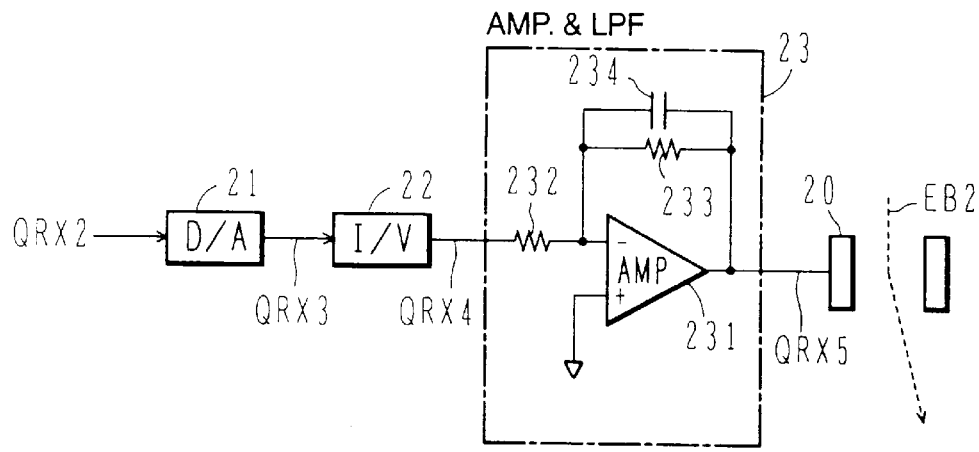
FIG. 14(A) shows a sub deflector drive circuit in the prior art.
FIG. 14(B) is a waveform diagram showing an operation of this circuit.
Figure 14:
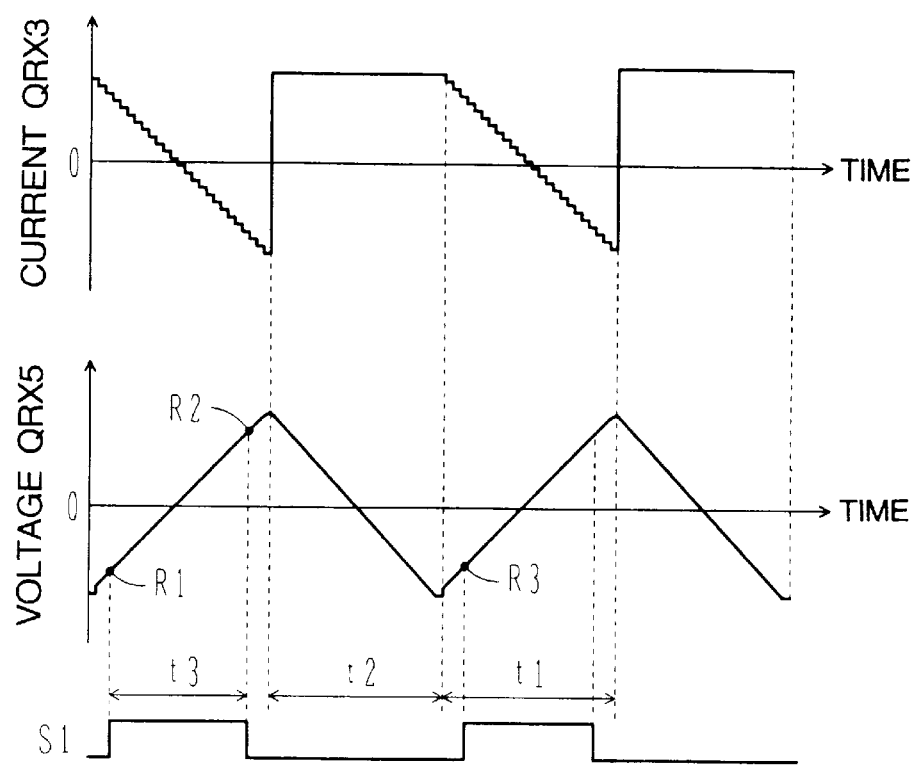

FIG. 7(A), which corresponds to FIG. 13(B) shows a method of charged particle multibeam scanning.

Since no data are present in cell stripes 132 to 135 in FIG. 13(B), the cell stripe 131 is reassigned as cell stripe 126 to be included in the subfield 12A and the subfield 13 is omitted in FIG. 7(A).

The vector OR1 of the scanning start point R1 in the subfield 12A relative to the fixed origin point O on the semiconductor wafer 10 is expressed as $$OR1 = OP1 + P1Q1 + Q1R1 \quad (1)$$

where,

OP1: a vector of scanning by the mobile stage 12 with P1 being the scanning position of the mobile stage P1Q1: a vector of the main scanning performed by the main deflector 54, with Q1 being the main scanning position Q1R1: a vector of the sub scanning performed by the sub deflector 20, with R1 being the sub scanning position. The mobile stage scanning position P1 is the intersection of the optical axis of the exposure system and the semiconductor wafer 10 and moves along L1 at a constant speed in the direction indicated with the arrow. The sum of the vector OP1 and the position vector of the mobile stage is constant. During sub scanning, although the main scanning vector P1Q1 is constant, the point Q1 conforms to the movement of the point P1.

The subfield 12A is scanned by the sub deflector 20 along the solid line L3 and the dotted line L4 in the order of cell stripes 121 to 126. The solid line L3 is during the exposure and the dotted line L4 is during blanking.

The range over which the multibeam EB2, which has passed through the BAA 30, can be deflected by the sub deflector is A1, indicated with the alternate long and short line, at the scanning start point R1 of the scanning of the subfield 12.

The number of cell stripes k that can be scanned by the sub deflector 20 with a constant main deflection satisfy $$kV\Delta t \leq AL < (k+1)V\Delta t \quad (2)$$

where

AL: distance between the sub scanning start point R1 and the boundary of range A1

Δt: the sum of cell stripe scanning time from the point R1 to the point R2 and the flyback time elapsing from the point R2 to the point R3

V: stage movement speed.

FIG. 7(A) shows a case when k=5 and the first to k-th cell stripes can be sub-scanned under the constant main scanning vector P1Q1 and the cell stripe 126 cannot be sub-scanned. However, since the quantity of data is huge, only one set of coordinates data concerning the main scanning position is provided in each subfield in the exposure data.

Figure 9:
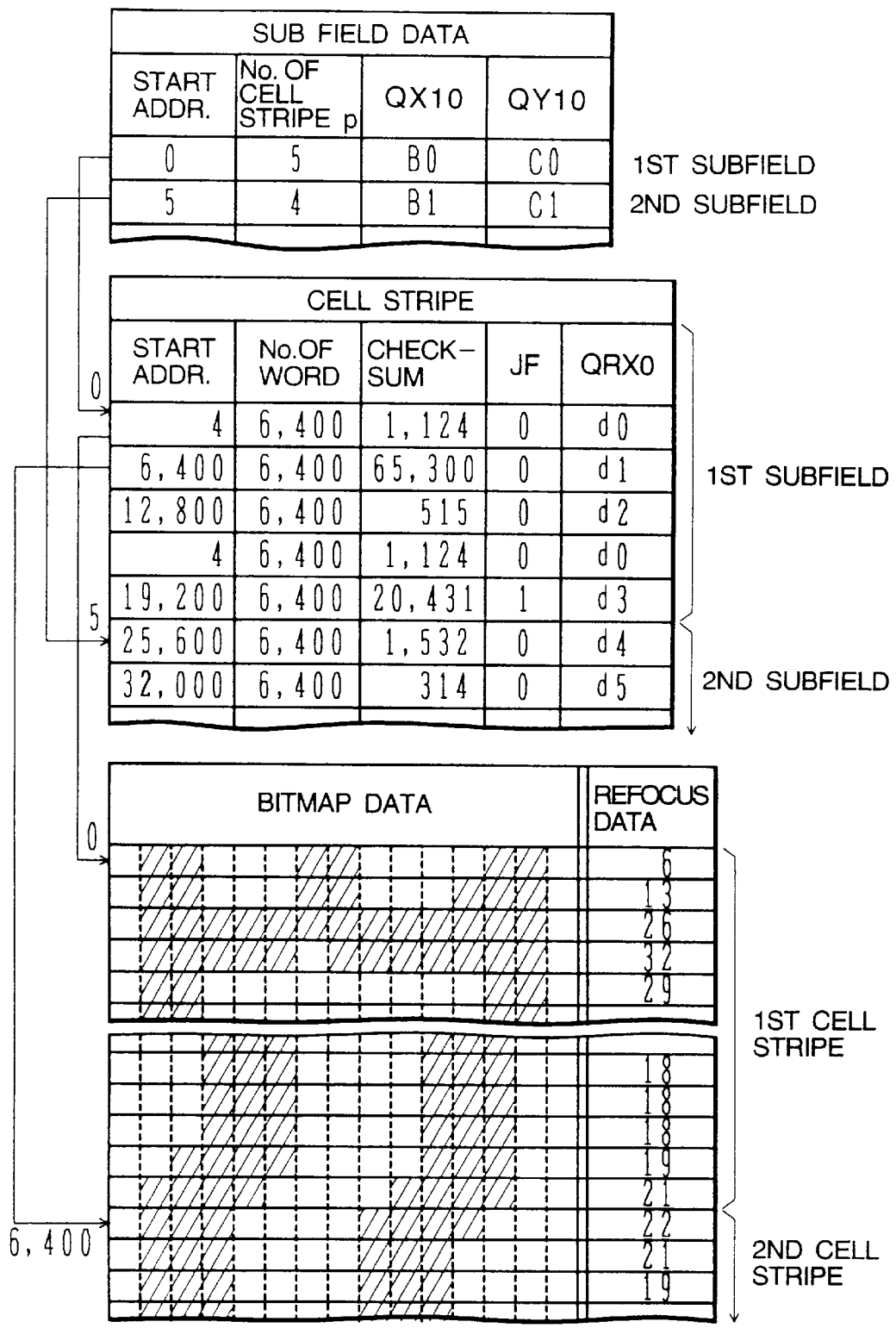
FIG. 9 illustrates hierarchical exposure data.

FIG. 9 shows the hierarchical exposure data.

The subfield data for each subfield are comprised of the start address of the cell stripe data, the number of cell stripes p, the X coordinate QX10 of the main scanning position and the Y coordinate QY10 of the main scanning position.

The cell stripe data for each stripe are comprised of a start address of the bitmap data in a cell stripe, the number of words of the bitmap data in the cell stripe, the checksum of the bitmap data in the cell stripe, a jump flag JF indicating whether the current stripe is the k-th cell stripe ('1') or not ('0') and the X coordinate QRX0 of the sub scanning position relative to the main scanning position (QX10, QY10). The checksum represents the total bit number of "1" in the bitmap data of a cell stripe.

In the bitmap data shown in FIG. 9, a hatched square indicates bit "1" and it corresponds to an ON beam which passes through the BAA 30 and the aperture stop 51 in FIG. 1. The number of bits in one word (one row) of the bitmap data is equal to n as in FIG. 15.

Figure 15:
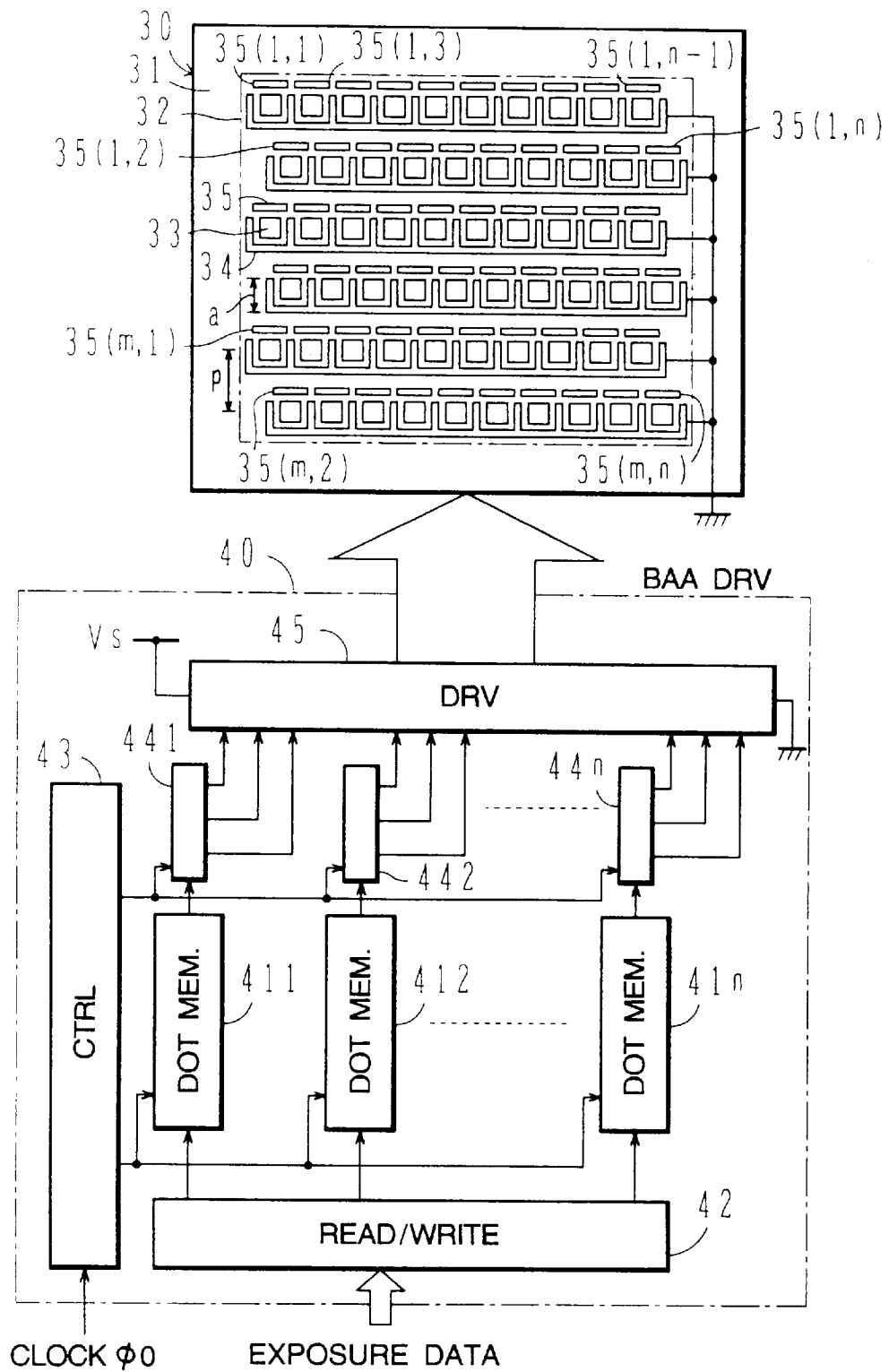
FIG. 15 shows a BAA and multibeam control circuit in the prior art.
Figure 16:
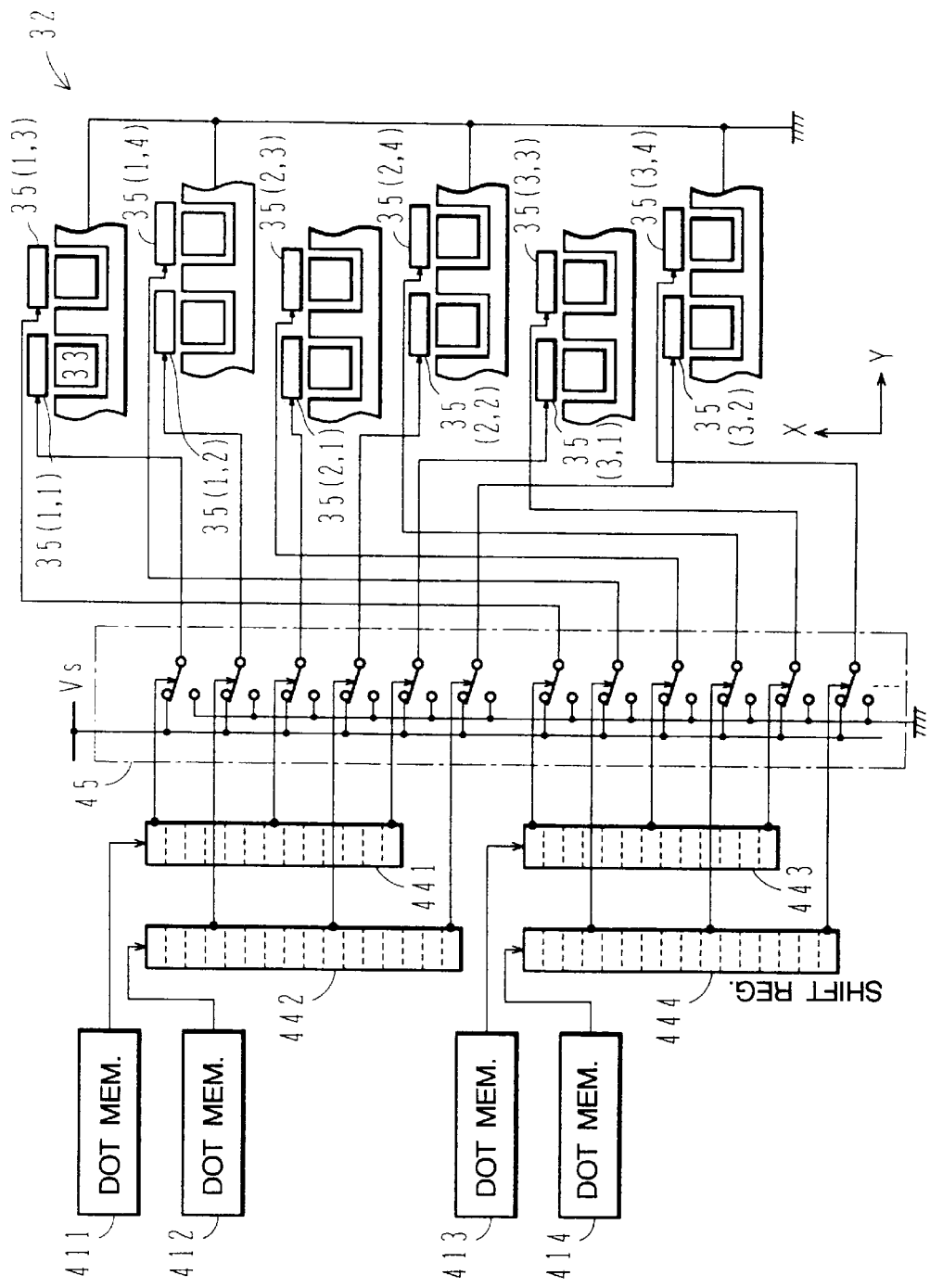
FIG. 16 shows a portion of the circuit in FIG. 15.

The refocus data, which are equal to the number of the ON beams passing through the BAA 30, correspond to individual words in the bitmap data of a cell stripe. The refocus data in FIG. 9 shows a case in which m in FIG. 15 is at 3 and the following calculation is performed using the number of ON beams:

| number of ON beams | refocus data |
|---|---|
| 6 | 6 |
| 7 | 6 + 7 = 13 |
| 13 | 13 + 13 = 26 |
| 12 | 26 + 12 − 6 = 32 |
| 4 | 32 + 4 − 7 = 29 |

Figure 2:
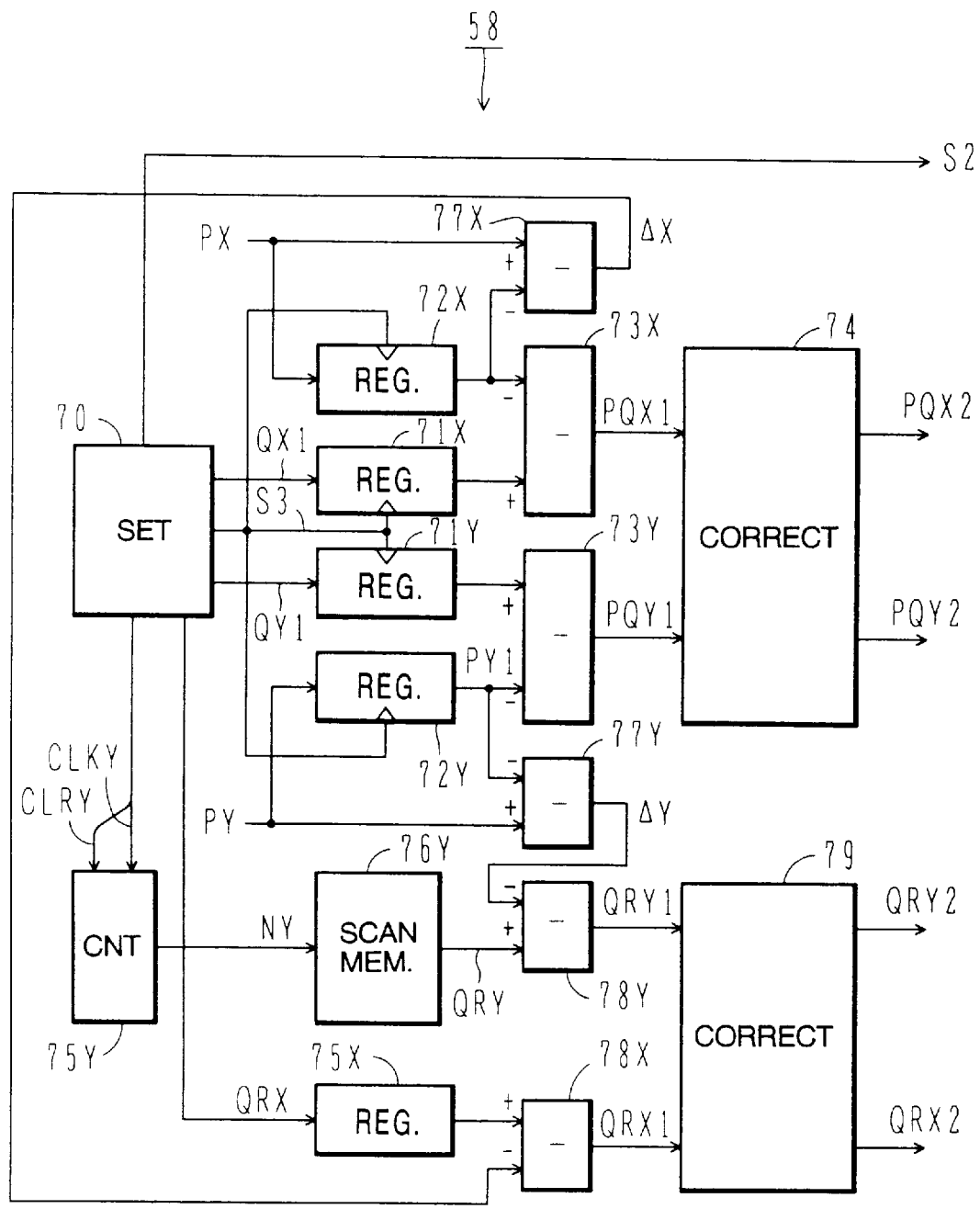
FIG. 2 is a block diagram showing a structural example of a deflection quantity calculating circuit in FIG. 1.
Figure 3:
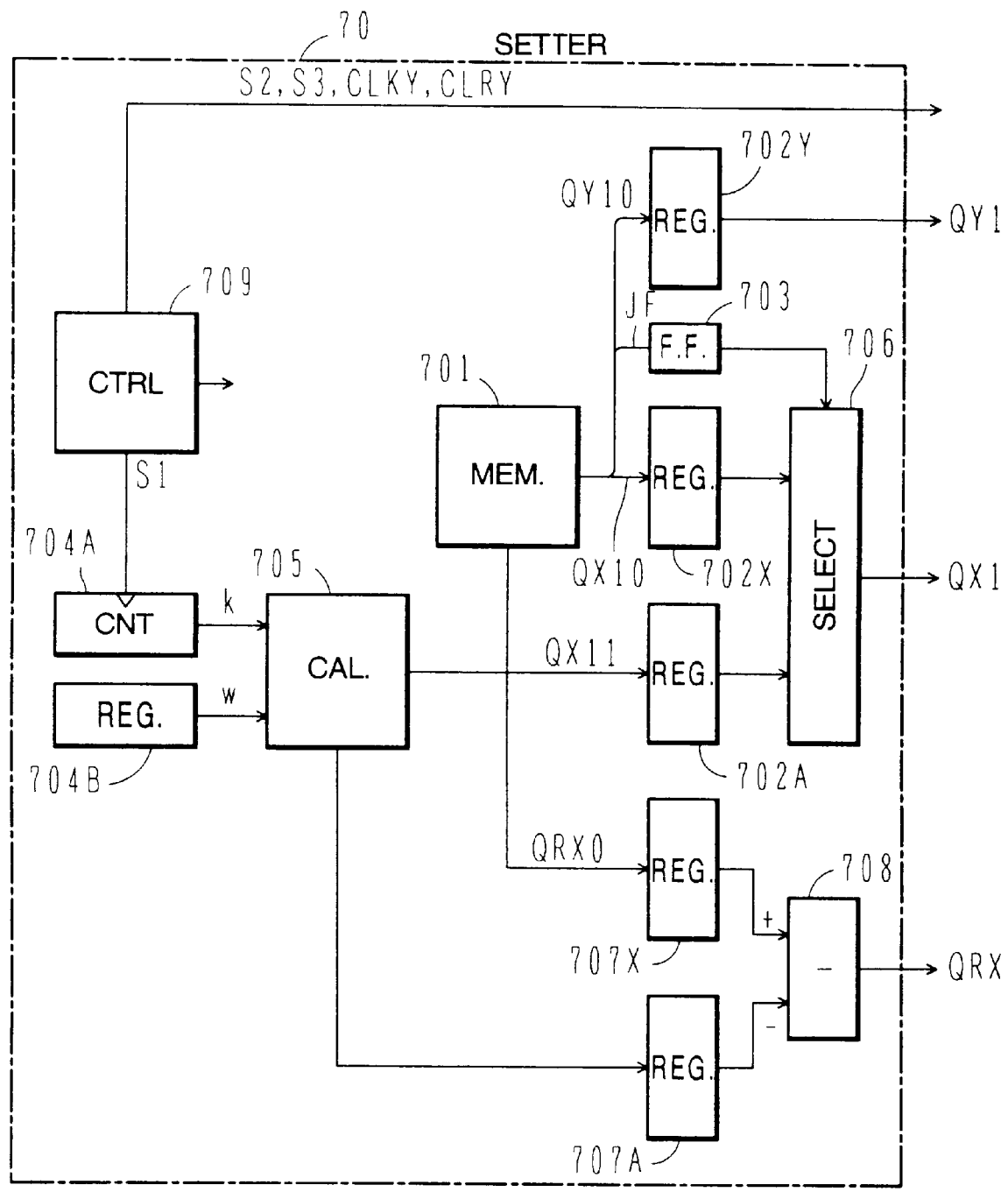
FIG. 3 is a block diagram showing a structure of a main portion of the setting circuit in FIG. 2.

FIG. 3 shows the structure of the main portion of the setting circuit 70 in FIG. 2.

In a buffer memory 701, the subfield data and the cell stripe data, excluding the checksum in FIG. 9, are written in advance and every time the scanning of a subfield ends, the X coordinate QX10 and the Y coordinate QY10 of the main scanning position of the next subfield are respectively held at a register 702X and a register 702Y. Also, every time the scanning of a cell stripe starts, the jump flag JF of that cell stripe is held in a flip-flop 703. A counter 704A is cleared to 0 every time the scanning of a subfield ends and is incremented by a control signal S1 in FIG. 6 every time the scanning of a cell stripe starts.

When the jump flag JF is at "1", the calculation part 705, using the number of cell stripes p in the subfield, the count k on the counter 704A and the width w of a cell stripe set in a register 704B, calculates the main scanning position X coordinate QX11 as $$QX11=QX10+(2p-k)w/2 \quad (3)$$

and the QX11 is held in a register 702A.

A selector 706 selects the output QX10 from the register 702X as QX1 when the jump flag JF is at "0" and selects the output QX11 from the register 702A as QX1 when the jump flag JF is at "1". As explained later, QX1 is used as the X coordinate of the next main scanning position.

As for the Y coordinate of the main scanning position, since there is no change even when the jump flag JF is at "1", QY10 held in the buffer register 702Y can be used as QY1.

Through such processing, when the scanning of the cell stripe 125 ends in FIG. 7(A), for instance, the main scanning position jumps from Q2 to Q4.

Since it is necessary to subtract (2p−k) w/2 in the formula (3) above to obtain the X coordinate of the subfield 126 relative to the main scanning position after the jump, correction is made in the following manner:

Every time the scanning of a cell stripe ends, the X coordinate QRX0 of the sub scanning position of the next cell stripe relative to the main scanning position is held in a register 707X. Normally 0 is held in a register 707A, but when QX11 is held in the register 702A, the register 707A holds (2p−k)w/2 and is cleared to 0 when the scanning of the subfield ends. The difference between the output of the register 707X and the output of the register 707A is calculated in a subtractor 708 as the corrected sub scanning position QRX.

A control circuit 709 generates and outputs various types of control signals for component elements inside and outside the setting circuit 70.

In the method of scanning described above, since the change in the main scanning vector is smaller than that when jumps are made between subfields, the wasted settling time during the step change is reduced and an improvement in the throughput of exposure is achieved. Moreover, since the cell stripes do not have to be shortened in order to ensure that the sub scan never exceeds the sub scanning range A1, an increase in the total number of cell stripes can be avoided and reduction in the throughput due to an increased number of occurrences of flyback during sub scanning is prevented.

(4) Deflection quantity calculating circuit 58

A structural example of the deflection quantity calculating circuit 58 in FIG. 1 is shown in FIG. 2. FIG. 7(B) shows the relationship of the data in FIG. 2. FIG. 7(B) corresponds to the scanning shown in FIG. 7(A) and point P indicates an arbitrary position between the point P1 and the point P2.

Normally, at the end of the scanning of each subfield, or if the jump flag JF is at "1" at the end of the cell stripe in which the jump flag is at "1", the setting circuit 70 causes a register 71X and a register 71Y to hold the X coordinate QX1 and the Y coordinate QY1 of the main scanning position Q1 respectively, at a timing of a latch pulse S3 and also causes a register 72X and a register 72Y to hold the X coordinate PX and the Y coordinate PY of the stage scanning position P as PX1 and PY1 respectively.

A subtractor 73X calculates the difference PQXL between the contents QX1 of the register 71X and the contents PX1 of the register 72X and a subtractor 73Y calculates the difference PQY1 between the contents QY1 of the register 71Y and the contents PY1 of the register 72Y.

A correction circuit 74 corrects the deviation, which are in the direction of the deflection of the main deflector 54 and the ratio (magnetic field intensity)/(the input current) of the main deflector 54, from the design values for (PQX1, PQY1), and outputs the result as (PQX2, PQY2). The correction circuit 74 is a primary conversion circuit for the input coordinates and, in ideal case, functions as a unit matrix.

Every time the scanning of a cell stripe ends, a counter 75Y is cleared with a clear signal CLRY from the setting circuit 70 and after the control signal S2, shown in FIG. 6, is a kept at low for a specific length of time, a clock CLKY is supplied to the counter 75Y and counted. The count NY on the counter 75Y is supplied to a scanning memory 76Y as an address input. Also, every time the scanning of a cell stripe ends, the X coordinate of the next cell stripe is held in a register 75X.

The difference ΔX between PX and PX1 is calculated by a subtractor 77X and the difference ΔY between PY and PY1 is calculated by a subtractor 77Y. The difference QRX1 between QRX and ΔX is calculated by a subtractor 78X and the difference QRY1 between QRY and ΔY is calculated by a subtractor of 78Y. A correction circuit 79 corrects the deviation, which is in the direction of the deflection of the sub deflector 20 and the ratio (electric field intensity)/(input current) of the sub deflector 20, from the design values for (QRX1, QRY1) and outputs the result as (QRX2, QRY2). The correction circuit 79 is a primary conversion circuit for the input coordinates and, in ideal case, functions as a unit matrix.

The main deflection quantity PQX2 and the sub deflection quantity QRX2 are supplied to the D/A converter 59 and the D/A converter 21 in FIG. 1 respectively and the main deflection quantity PQY2 and the sub deflection quantity QRY2 are supplied to drive circuits (not shown) provided for the direction Y deflection components of the deflection imparted by the main deflector 54 and the sub deflector 20 respectively.

(5) BAA & refocus coil drive circuit 62

Figure 5:
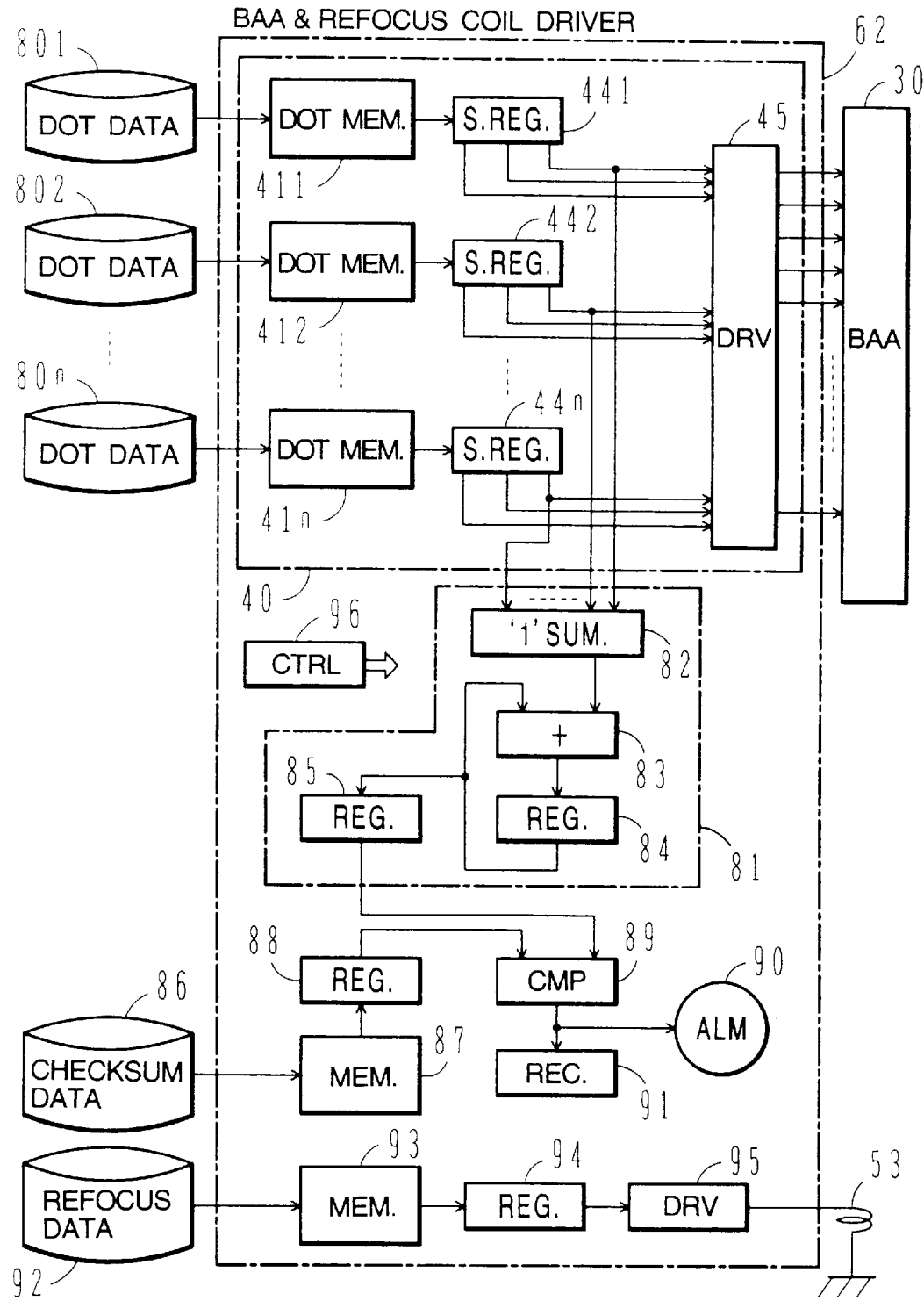
FIG. 5 is a block diagram showing a structural example of a BAA & refocus coil drive circuit in FIG. 1.

FIG. 5 shows a structural example of the BAA & refocus coil drive circuit 62 in FIG. 1.

Although a BAA drive circuit (multibeam control circuit) 40 of the BAA & refocus coil drive circuit 62 is simplified in FIG. 5, it is identical to the BAA drive circuit 40 in FIG.

15. The dot data from external storage devices 71 to 77n are written in dot memories 411 to 41n of the BAA drive circuit 40 respectively.

The BAA & refocus coil drive circuit 62 is provided with a checksum calculating circuit 81. In this circuit 81, the end bit in each of the shift registers 441 to 44n is supplied to a "1" totaling circuit 82, which determines the total number of bits that are set at "1" and provides the value to one of the inputs of an adder 83. The output of the adder 83 is held in a register 84 in the same cycle as the outputs from the shift registers 441 to 44n, and that value is supplied to another input of the adder 83. Thus, the accumulated value of the outputs of the "1" totaling circuit 82 is held in the register 84. Each time the accumulated value corresponding to one cell stripe is held at the register 84, this value is also held in a register 85 as a checksum.

In the meantime, checksum data read into a buffer memory 87 from an external storage device 86 are sequentially held in a register 88, in correspondence to the output from the register 85. Then the output from the register 88 and the output from the register 85 are compared to each other at a comparator 89 and if it is detected that they do not match, an alarm unit 90 operates and an error address and a time point at which the error occurred are recorded in a recording device 91.

Since the checksum calculating circuit 81 comprises one "1" totaling circuit 82, one adder 83 and two registers 84 and 85 for n bits, e.g., 512 bits, its structure is simpler than that required for a parity check circuit and an ECS circuit, which will require a great number of such circuits and, at the same time, error checking can be performed at a higher speed than in a complex ECS circuit. Consequently, since it is not necessary to lower the speed of data transfer to the BAA 30, an advantage is achieved in that a reduction in throughput of exposure is prevented.

In the refocus coil drive circuit part, refocus data are written from an external storage device 92 into a buffer memory 93, the refocus data are sequentially read out from the buffer memory 93 in correspondence to the input of a driver 45 to be held at a register 94, and a drive current which is in proportion to that value is supplied to the refocus coil 53 by a driver 95.

(6) Data generating circuit 61

Figure 4:
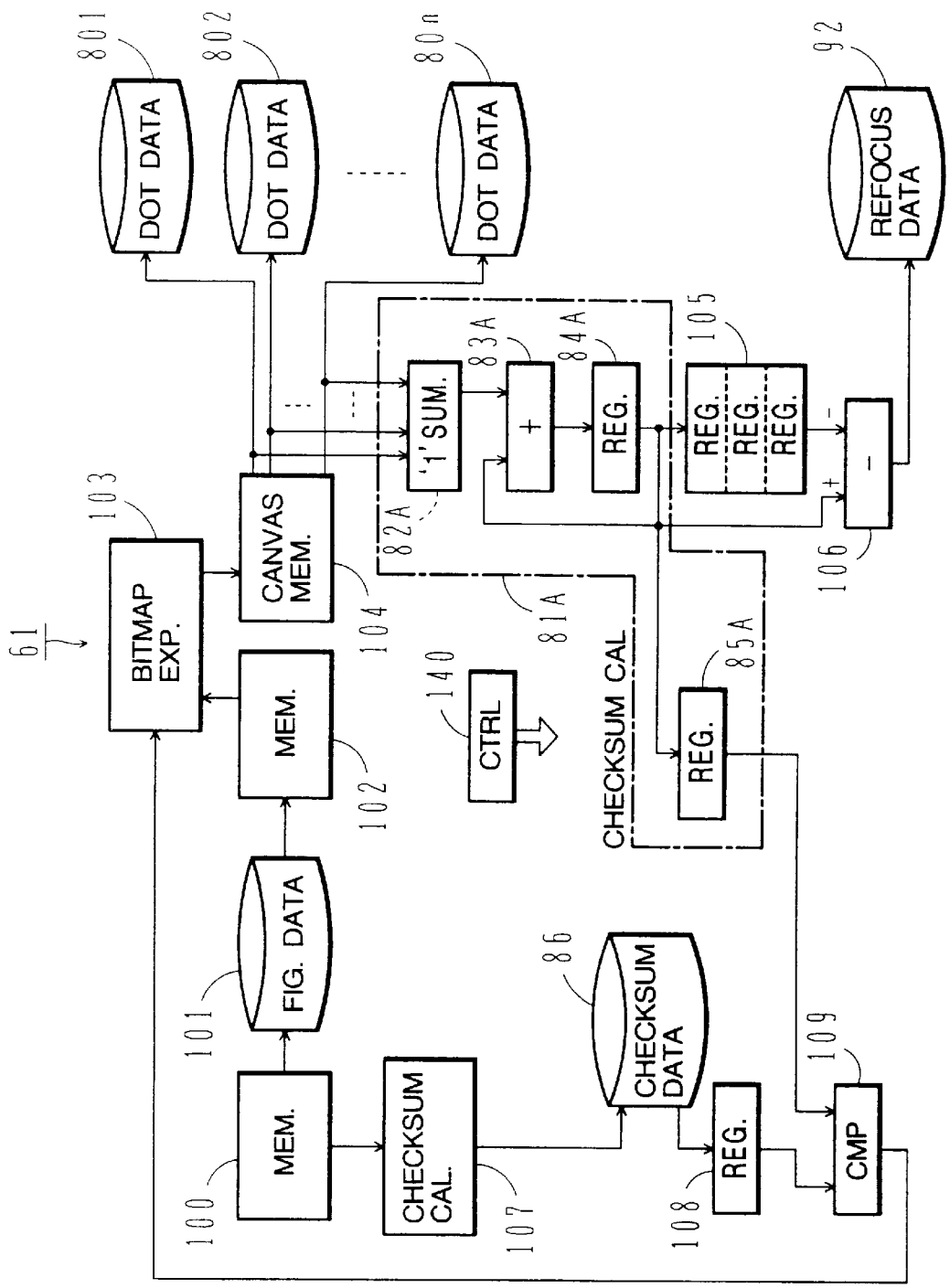
FIG. 4 is a block diagram showing a structural example of a data generating circuit in FIG. 1.

FIG. 4 shows a structural example of the data generating circuit 61 shown in FIG. 1.

Figure 8:
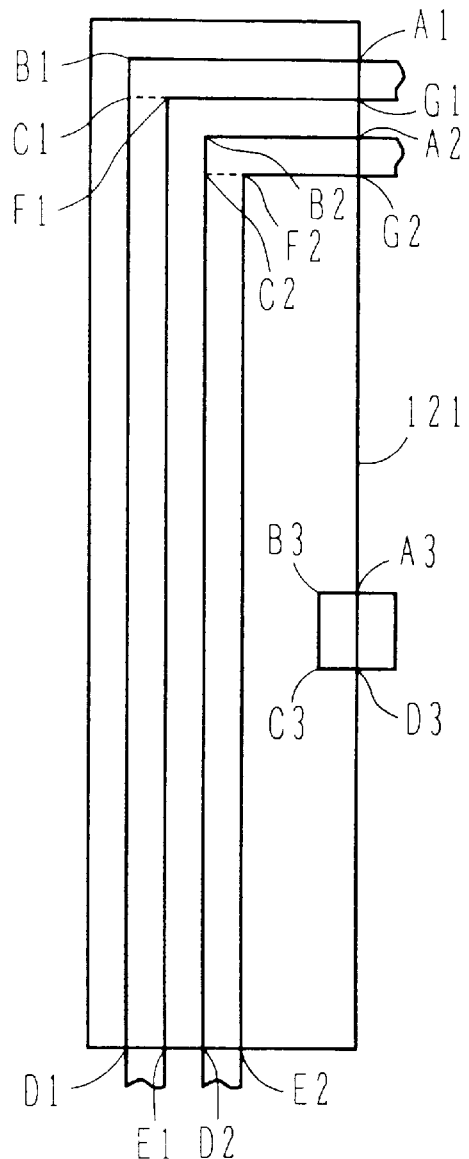
FIG. 8(A) illustrates figure data inside a cell stripe.
FIG. 8(B) illustrates a basic figure.
Figure 8:
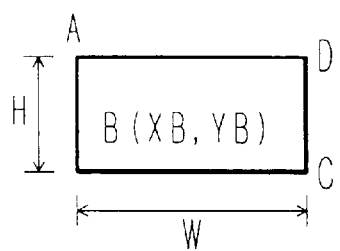

The design data are converted into a format for an exposure system and then are converted to figure data. The figure data are stored in an external storage device 101 via a buffer memory 100. These figure data are partitioned into cell stripes and, as shown in FIG. 8(A), the inside of a cell stripe is divided, for instance, into patterns A1B1C1D1E1F1G1, A2B2C2D2E2F2G2 and A3B3C3D3, and they are further parsed into specific basic figures such as rectangles or triangles. For instance, the pattern A1B1C1D1E1F1G1 is divided into a rectangle A1B1C1G1 and a rectangle C1D1E1F1. In FIG. 8(B), the figure data of the rectangle ABCD is expressed with the code FC which means a rectangle, the coordinates (XB, YB) of the point B and width W and the height H of the rectangle.

Consequently, the checksum can be easily obtained by calculating the total area of the figure inside the cell stripe before the figure data are expanded (converted) into a bitmap.

In FIG. 4, the figure data stored in the external storage device 101 are supplied to a bitmap expansion circuit 103 via a buffer memory 102 in units of cell stripes and the bitmap expansion circuit 103 expands them into bitmap on the canvas memory 104 for one cell stripe. The bitmap data of a cell stripe in the canvas memory 104 are read out sequentially from the top portion of the cell stripe in units of n bits, which correspond to the width of the cell stripe. The bitmap data that have been read out in this manner are stored in external storage devices 801 to 80n on the one hand, and are supplied to a "1" totaling circuit 82A of the checksum calculating circuit 81A on the other hand. The checksum calculating circuit 81A is structured identically to the checksum calculating circuit 81 shown in FIG. 5, with its component elements 82A to 85A corresponding to the component elements 82 to 85 respectively.

The output from the register 84A is supplied to a word shift register group 105 and is shifted in units of registers in the column direction. The number of registers in the word shift register group 105 is equal to the number of logical lines m in the BAA 30 in FIG. 15. The difference between the value held at the register 84A and the value output from the head portion of the word shift register group 105 is calculated by a subtractor 106. This difference is equal to the number of ON beams passing through the BAA 30 and the aperture stop 51 in FIG. 1 and is stored in the external storage device 92 as refocus data.

The checksum calculating circuit 81A and the refocus calculating circuit having elements 82A, 83A, 84A, 105 and 106 are provided with an "1" totaling circuit 82A, an adder 83A and a register 84A for common use, and its structure is simpler compared to that of a parity check circuit or a ECS circuit.

In FIG. 4, a checksum calculating part 107 obtains a checksum by calculating the total area of the figure inside the cell stripe for the figure data held in the buffer memory 100, and then the checksum is stored in the external storage device 86. The stored checksum data are held in a register 108 sequentially in correspondence to holding in the register 85A. A comparator 109 compares the contents of the register 108 against the contents of the register 85A and provides the results of the comparison to the bitmap expansion circuit 103.

When the output from the comparator 109 indicates a non-match, i.e., when a data error has occurred in the buffer memory 102, the bitmap expansion circuit 103, the canvas memory 104, or the like, the bitmap expansion circuit 103 performs the bitmap expansion processing again for the cell stripe. With this, the data stored in the external storage devices 801 to 80n, 86 and 92 are overwritten for that cell stripe, improving the reliability of the exposure data.

While the BAA & refocus coil drive circuit 62 in FIG. 5 performs real time processing, the data generating circuit 61 in FIG. 4 performs batch processing asynchronously with the BAA & refocus coil drive circuit 62 and, as a result, error correction through reprocessing in this manner becomes possible.

A control circuit 140 performs control of the component elements shown in FIG. 4 so that the operations described above can be executed. Note that subfield data and the cell stripe data except for the checksum, in FIG. 9, are generated at a stage preceding the buffer memory 100.

Second Embodiment

Figure 10:
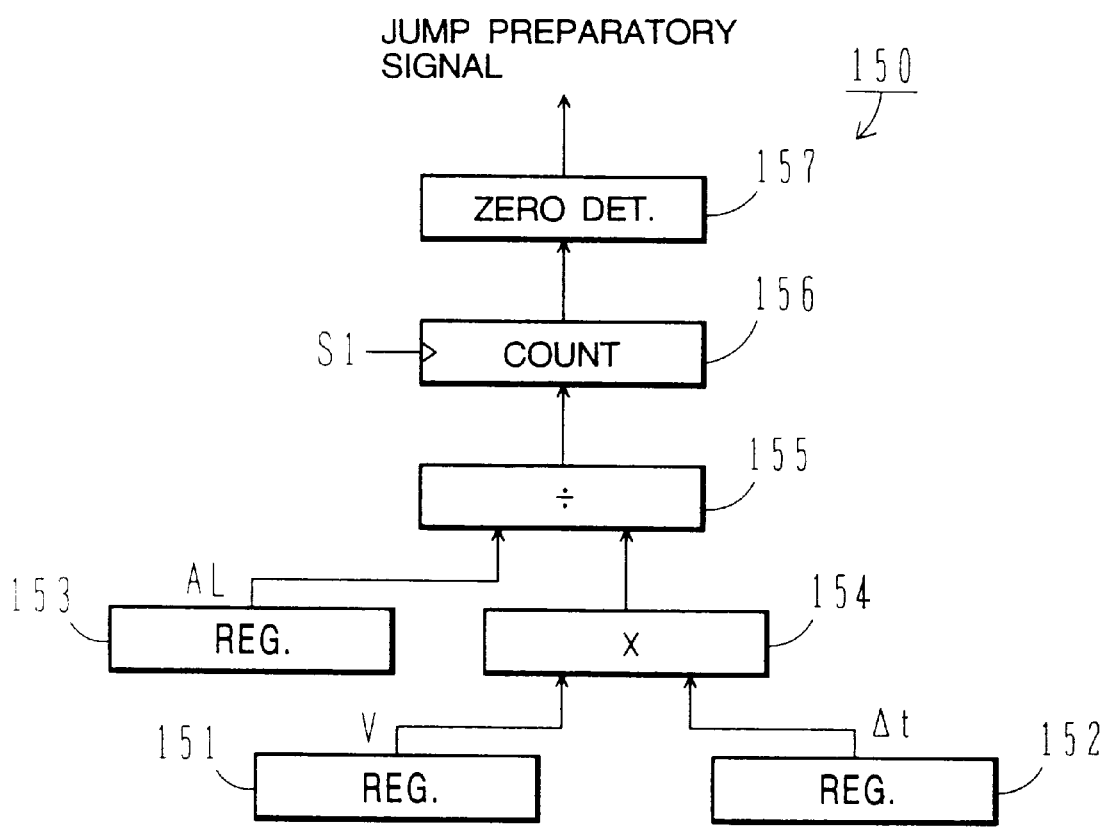
FIG. 10 is a block diagram showing a jump judgment circuit in the second embodiment according to the present invention.

In the first embodiment described above, the formula (2) is calculated to generate a jump flag JF while the figure data are not yet expanded in bitmap data. It is desirable to determine the value k in the formula (2) in real time during exposure, since the jump flag storage apparatus will then be unnecessary. FIG. 10(A) shows a jump judgment circuit 220 in the second embodiment according to the present invention.

V, Δt and AL in the formula (2) above, are set at registers 151, 152 and 153 respectively. A multiplier 154 calculates V·Δt and a divider 155 calculates AL/ (V·Δt). The integer portion k of the output value of the divider 155 is then loaded to a down-counter 156. This loading is performed during the settling time of the main deflector drive circuit preceding the start of subfield scanning.

When the scanning of a subfield starts, a control signal S1, shown in FIG. 6, is provided to the clock input of the down-counter 156, and the count on the down-counter 156 is decremented every time the scanning of a cell stripe starts. When this count becomes 0, a jump preparatory signal output from a zero detection circuit 157 is set to high and processing that is identical to that performed when the jump flag JF is at "1" is performed in the setting circuit 70 in FIG. 2.

Instead of calculating k in the formula (2), the circuit may be structured to make a decision that the cell stripe for which sub scanning is currently in progress is the k-th cell stripe, i.e., to output a jump preparatory signal when time T $$T = AL/V - t \quad (3)$$

has elapsed after the start of cell stripe scanning.

Third Embodiment

Figure 11:
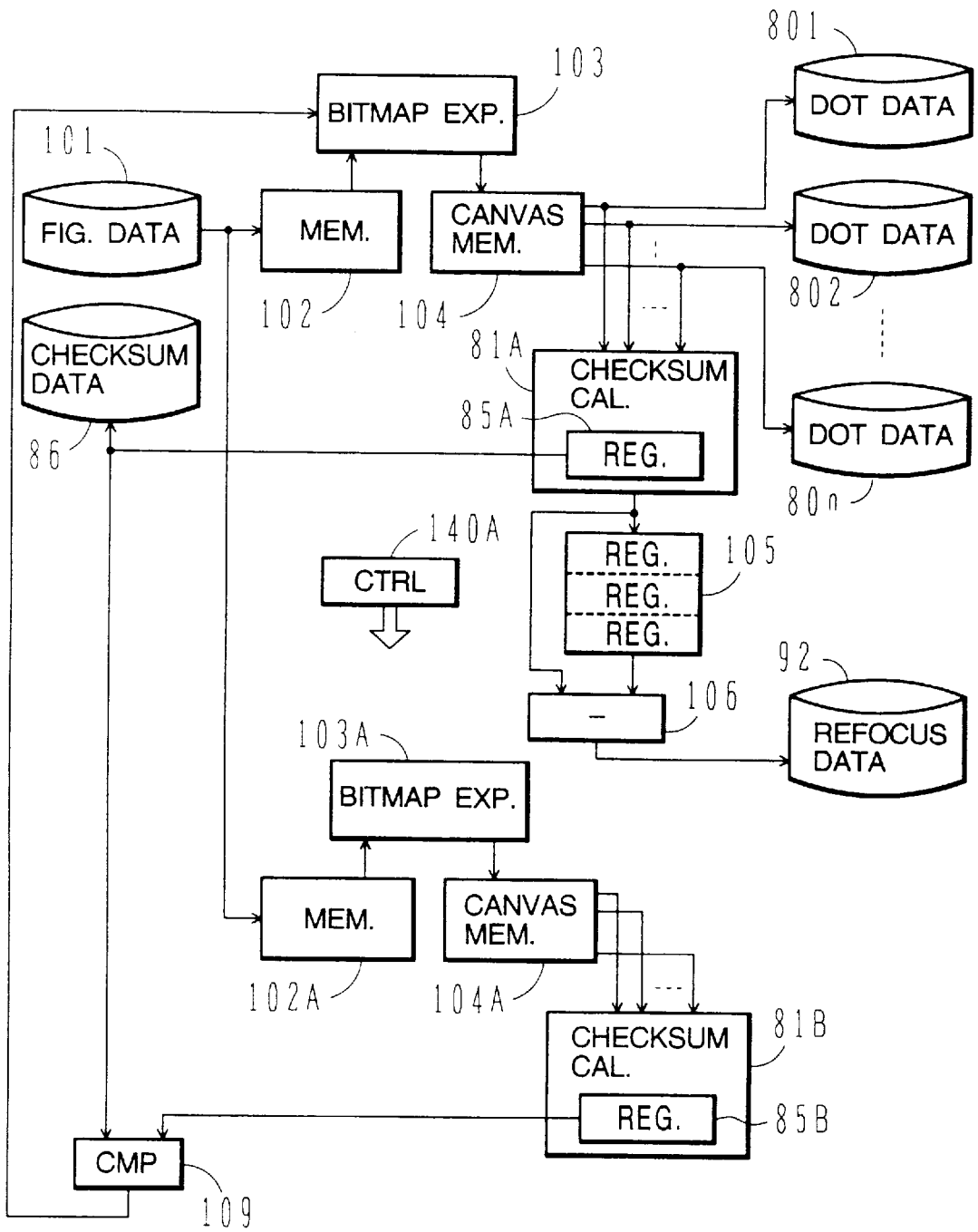
FIG. 11 is a block diagram showing a data generating circuit in the third embodiment according to the present invention.

In FIG. 4, although the checksum is calculated while the figure data are not yet expanded in bitmap data, it is also possible to detect an error by providing two sets of circuits, each set comprising the buffer memory 102, the bitmap expansion circuit 103, the canvas memory 104 and the checksum calculating circuit 81A and by comparing their checksums to each other. FIG. 11 shows a data generating circuit structured to achieve this, as the third embodiment.

In FIG. 11, a buffer memory 102A, a bitmap expansion circuit 103A, a canvas memory 104A, a checksum calculating circuit 81B and a register 85B are structured identically to the buffer memory 102, the bitmap expansion circuit 103, the canvas memory 104, the checksum calculating circuit 81A and the register 85A respectively. A control circuit 140A, implements the control required for the component elements shown in FIG. 11.

Every time the entire data corresponding to one cell stripe are output from the canvas memories 104 and 104A, the contents in the register 85A are stored as a checksum in the external storage device 86 and if the output from the comparator 109 indicates a non-match, the bitmap expansion for that cell stripe is performed again, to rewrite the corresponding values stored in the external storage devices 86 and 92.

When the third embodiment is compared against the circuit shown in FIG. 4, it is obvious that the structure of the circuit in FIG. 4 is simpler. This advantage is derived from the fact that the checksum is more easily obtained, when the figure data are not yet expanded in bitmap data, by calculating the checksum in units of cell stripes.

Fourth Embodiment

Figure 12:
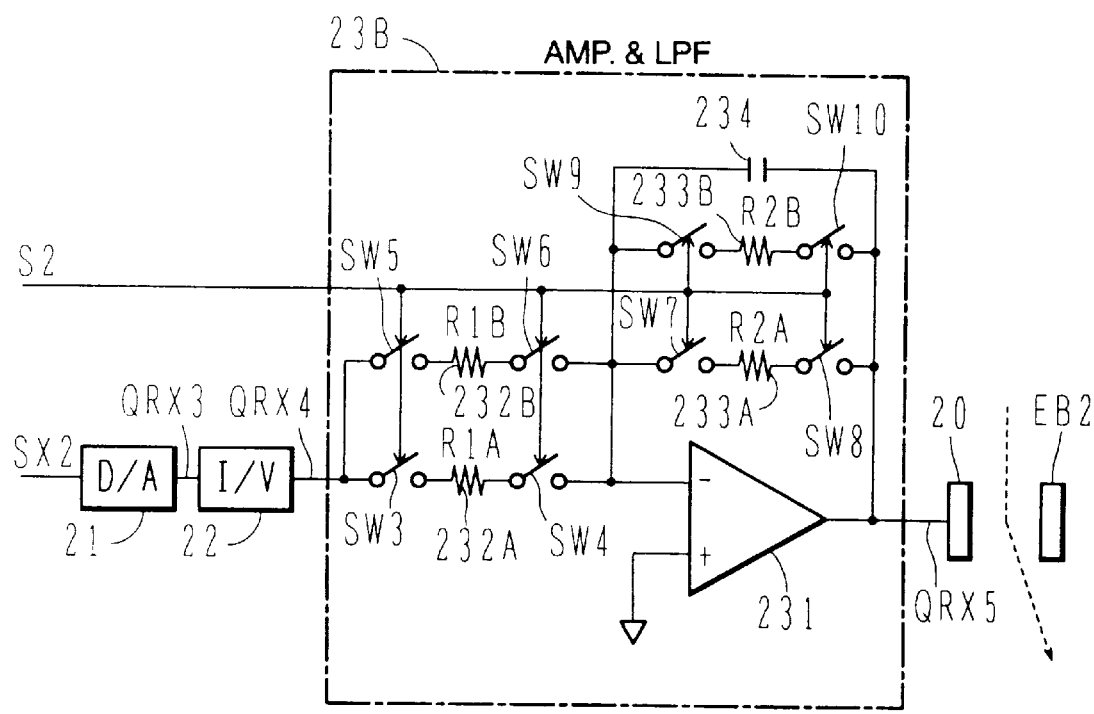
FIG. 12 shows a sub deflector drive circuit in the fourth embodiment according to the present invention.

FIG. 12 shows a sub deflector drive circuit in the fourth embodiment according to the present invention.

In this circuit, an amplification & low pass filter circuit 28B is employed in place of the amplification & low pass filter circuit 23A shown in FIG. 1.

When the exposure is in progress with the control signal S2 at high, switching elements SW3 and SW4 are turned ON, switching elements SW5 and SW6 are turned OFF, switching elements SW7 and SW8 are turned ON and switching element SW9 and SW10 are turned OFF. During a flyback, with the control signal S2 at low, the switching elements SW3 and SW4 are turned OFF, the switching elements SW5 and SW6 are turned ON, the switching elements SW7 and SW8 are turned OFF and the switching element SW9 and SW10 are turned ON.

When the resistance value of resistors 232A, 232B, 233A and 233B are designated R1A, R1B, R2A and R2B respectively, the amplification factor R2A/R1A during exposure is made to be equal to the amplification factor R2B/R1B during flyback. In addition, since R2A<R2B, the cutoff frequency during flyback is lower than that during exposure and t2/t1 in FIG. 6 can be reduced, compared to that in the prior art.

Although preferred embodiments of the present invention has been described, it is to be understood that the invention is not limited thereto and that various changes and modifications may be made without departing from the spirit and scope of the invention.

For instance, the amplification & low pass filter circuit 23 which is structured to perform inversion amplification in FIG. 1, may be structured to perform non-inversion amplification. In addition, the operation amplification circuit 231 may have a differential structure in which a pair of signals with reverse polarities from each other are output for a pair of deflection electrode plates that face opposite each other. These points apply to the amplification & low pass filter circuit 23B shown in FIG. 12, as well.

Moreover, instead of the mobile stage scanning position P (PX, PY) in FIG. 1, pulses, the number of which is in proportion to the mobile stage detection position itself or in proportion to the movement distance may be used.

What is claimed is:

1. A system for exposing a pattern on an object using a charged particle beam, said system comprising:

a blanking aperture array mask having a substrate, an aperture array on said substrate and a pair of electrodes on said substrate for each aperture, said blanking aperture array being positioned in a path of said charged particle beam;

a charged particle beam radiating apparatus for making a multibeam by projecting said charged particle beam on to said blanking aperture array mask;

a multibeam controller for selectively providing a voltage between each of said pairs of electrodes based upon pattern bitmap data to selectively radiate said charged particle beam passed through said apertures on said object;

a deflector for deflecting said multibeam;

a first checksum calculator for counting a total bit number of one of "1's" and "0's" in said bitmap data within a band area as a first checksum before said bitmap data is supplied to said multibeam controller, said band area being for continuously scanning said charged particle multibeam on said object;

a second checksum calculator for obtaining a second checksum of said bitmap data within said band area before said bitmap data is supplied to said multibeam controller, said second checksum corresponding to said first checksum; and a comparator for comparing said first checksum against said second checksum.

2. A system for exposing a pattern on an object using a charged particle beam, comprising:

a blanking aperture array mask having a substrate, an aperture array on said substrate and a pair of electrodes on said substrate for each aperture, said blanking aperture array being positioned in a path of said charged particle beam;

a charged particle beam radiating apparatus for making a multibeam by projecting said charged particle beam on to said blanking aperture array mask;

a multibeam controller for selectively providing a voltage between each of said pairs of electrodes based upon pattern bitmap data to selectively radiate said charged particle beam passed through said apertures on said object;

a mobile stage for mounting said object;

a sub deflector for deflecting said multibeam within a sub deflection range;

a main deflector for deflecting said multibeam within a main deflection range, said main deflection range being larger than said sub deflection range;

means for dividing an exposure area into main rectangular areas and for dividing each of said main rectangular areas into sub rectangular areas, said sub rectangular areas in the same main rectangular area being identical bands and being parallel to one another;

means for determining a value k that satisfies $kV \Delta t \leq AL < (k+1) V \Delta t$, where AL is a distance along a direction of a movement of said mobile stage between a boundary of said sub rectangular area and a boundary of a range to be able to scan by said sub deflector at a first start time point of a sub scanning, and $\Delta t$ is a time spanning from a start point of said sub scanning to a next start point of said sub scanning; and $\Delta$ is a time spanning from a start point of said sub scanning to a next start point of said sub scanning; and exposure controller for scanning linearly once as said sub scanning by said sub deflector along said sub rectangular area to expose said sub rectangular area, with moving said mobile stage in a length direction of said sub rectangular area at a constant speed V and with making a deflection by said main deflector constant, for exposing k number of said sub rectangular areas lying continuously in parallel to each other as a first exposing area by repeating said sub scanning k number of times, if k is smaller than p which is a number of said sub rectangular areas in one of said main rectangular areas, for jumping a deflection by said main deflector toward an approximate center of remaining sub rectangular areas whose number is (p-k) inside said main rectangular areas after said first exposing area, and for exposing remained (p-k) number of said sub rectangular areas as a second exposing area by repeating said sub scanning (p-k) times after said jumping is settled.

3. A system for exposing a pattern on an object using a charged particle beam, comprising:

a blanking aperture array mask having a substrate, an aperture array on said substrate and a pair of electrodes on said substrate for each aperture, said blanking aperture array being positioned in a path of said charged particle beam;

a charged particle beam radiating apparatus for making a multibeam by projecting said charged particle beam on to said blanking aperture array mask;

a multibeam controller for selectively providing a voltage between each of said pairs of electrodes based upon pattern bitmap data to selectively radiate said charged particle beam passed through said apertures on said object;

a deflector for deflecting said multibeam; and a deflection controller including:

a digital-to-analog converter;

an amplifier & low pass filter having a control input to select one of a first cut-off frequency and a second cut-off frequency without changing an amplification factor, said second cut-off frequency being larger than said first cut-off frequency, said amplification & low pass filter circuit being connected between said digital-to-analog converter and said deflector; and a waveform controller for changing an output of said D/A converter a plurality of times so as to change an input drive signal of said deflector smoothly, and making said amplification & low pass filter circuit select said first cut-off frequency during said changing, and for changing said output of said D/A converter at one time while said charged particle multibeam is not irradiated on said object, and making said amplification & low pass filter circuit select said second cut-off frequency while said charged particle multibeam is not irradiated on said object.

* * * * *